(12) United States Patent
Miki et al.

(10) Patent No.: US 8,012,784 B2
(45) Date of Patent: Sep. 6, 2011

(54) METHOD FOR PRODUCING GROUP III NITRIDE SEMICONDUCTOR LIGHT EMITTING DEVICE, GROUP III NITRIDE SEMICONDUCTOR LIGHT EMITTING DEVICE, AND LAMP

(75) Inventors: Hisayuki Miki, Chiba (JP); Yasunori Yokoyama, Ichihara (JP); Takehiko Okabe, Ichihara (JP); Kenzo Hanawa, Ichihara (JP)

(73) Assignee: Showa Denko K.K., Tokyo (JP)

( * ) Notice: Subject to any disclaimer, the term of this patent is extended or adjusted under 35 U.S.C. 154(b) by 171 days.

(21) Appl. No.: 12/464,522

(22) Filed: May 12, 2009

(65) Prior Publication Data
US 2009/0283795 A1 Nov. 19, 2009

(30) Foreign Application Priority Data
May 14, 2008 (JP) .................... 2008-127733

(51) Int. Cl.
*H01L 21/00* (2006.01)

(52) U.S. Cl. .......... 438/46; 438/485; 438/513; 257/103; 257/E33.028; 257/E21.09

(58) Field of Classification Search .......... 438/46, 438/485, 513; 257/103, E33.028, E21.09
See application file for complete search history.

(56) References Cited

U.S. PATENT DOCUMENTS

| | | | |
|---|---|---|---|
| 5,122,845 A | 6/1992 | Manabe et al. | |
| 5,290,393 A | 3/1994 | Nakamura | |
| 6,713,789 B1 | 3/2004 | Shibata et al. | |
| 2002/0108847 A1* | 8/2002 | Cuomo et al. | 204/192.12 |
| 2003/0092230 A1* | 5/2003 | Koike et al. | 438/200 |

FOREIGN PATENT DOCUMENTS

| | | |
|---|---|---|
| JP | 04-297023 A | 10/1992 |
| JP | 3026087 B2 | 3/2000 |
| JP | 3440873 B2 | 8/2003 |
| JP | 3700492 B2 | 9/2005 |

OTHER PUBLICATIONS

N. Kumar, et al., "Deposition of Aluminum Nitride Films Using RF Reaction Sputtering", Mat. Res. Soc. Symp. Proc., 1986, pp. 357-363, vol. 68.

* cited by examiner

*Primary Examiner* — Tu-Tu V Ho
(74) *Attorney, Agent, or Firm* — Sughrue Mion, PLLC

(57) ABSTRACT

Provided is a method for producing a group III nitride semiconductor light emitting device capable of producing a group III nitride semiconductor light emitting device with excellent light emitting properties with excellent productivity; a group III nitride semiconductor light emitting device; and a lamp.

Provided is a method in which a buffer layer 12 composed of a group III nitride compound is laminated on a substrate 11 and then an n-type semiconductor layer 14 provided with an underlying layer 14a, a light emitting layer 15, and an p-type semiconductor layer 16 are sequentially laminated on the buffer layer 12, and is a method in which the buffer layer 12 is formed so as to have a composition of $Al_xGa_{1-x}N$ ($0 \leq X < 1$) by activating, with plasma, and thereby reacting at least a metallic Ga source and a gas containing a group V element, and the underlying layer 14 is formed on the buffer layer 12.

16 Claims, 7 Drawing Sheets

METHOD FOR PRODUCING GROUP III NITRIDE SEMICONDUCTOR LIGHT EMITTING DEVICE, GROUP III NITRIDE SEMICONDUCTOR LIGHT EMITTING DEVICE, AND LAMP

BACKGROUND OF THE INVENTION

1. Field of the Invention

The present invention relates to a method for producing a group III nitride semiconductor light emitting device and a group III nitride semiconductor light emitting device which are suitably used for a light emitting diode (LED), a laser diode, an electronic device, or the like, and also relates to a lamp.

2. Description of the Related Art

A group III nitride semiconductor has a direct transition type band gap of energy that corresponds to a range from the visible light to an ultraviolet region and also has excellent light emission efficiency. For this reason, it is manufactured into a semiconductor light emitting device such as a light emitting diode (LED) and a laser diode (LD), and used in various applications. In addition, the group III nitride semiconductor also has a potential of achieving excellent characteristics when used in electronic devices, as compared to the case where a conventional group III-V compound semiconductor is used.

Such a group III nitride semiconductor is generally produced by a metal organic chemical vapor deposition (MOCVD) method using trimethyl gallium, trimethyl aluminum, and ammonia as source materials. The MOCVD method is a process for growing crystals in which a carrier gas containing the vapor of source materials is delivered to the substrate surface, and the source materials are decomposed on the heated substrate surface.

Conventionally, a single crystal wafer of the group III nitride semiconductor has not been commercially available, and as a method for obtaining group III nitride semiconductors, a commonly used method grows crystals thereof on a single crystal wafer made of different materials. There is a large lattice mismatch between such a substrate made of different materials and the crystals of the group III nitride semiconductor epitaxially grown thereon. For example, when gallium nitride (GaN) is grown on a sapphire ($Al_2O_3$) substrate, there is a lattice mismatch of 16% between the two. When gallium nitride is grown on a SiC substrate, there is a lattice mismatch of 6%. In general, when there is a large lattice mismatch as in the above case, it will be difficult to directly grow crystals epitaxially on a substrate, and even when the crystals are grown, crystals with satisfactory crystallinity cannot be attained, which is a problem.

Accordingly, when epucted, in which a layer called a low temperature buffer layer composed of aluminum nitride (AlN) or aluminum gallium nitride (AlGaN) is first laminated on the substrate, and the crystals of the group III nitride semiconductor having a high itaxially growing the crystals of the group III nitride semiconductor on a sapphire single crystal substrate or a SiC single crystal substrate by the metal organic chemical vapor deposition (MOCVD) method, a method has been proposed and has been commonly condtemperature are epitaxially grown thereon (for example, refer to Patent Documents 1 and 2).

However, in the method described in Patent Documents 1 and 2, since there is basically no lattice matching between the substrate and the crystals of the group III nitride semiconductor grown thereon, a dislocation known as threading dislocation which extends towards the surface is incorporated inside the grown crystals. For this reason, distortions of crystals occur, as a result of which sufficient light emission cannot be achieved without the optimization of crystal structure, and the problems such as the decline in the productivity also arise.

On the other hand, in recent years, the use of a material having a crystal structure capable of lattice matching with the crystals of the group III nitride semiconductor as a substrate has been proposed. However, since such a material is reactive with ammonia, Ga, hydrogen, or the like which is used in the MOCVD method as a source material at high temperatures, it has been difficult to grow the crystals, as in the case where a substrate made of sapphire, SiC, or the like is used, by the MOCVD method.

In addition, since inside a reaction apparatus is generally decompressed and gas is circulating therein at an extremely high flow rate, the semiconductor source gas flows into the side surface of the substrate and may even reach the back surface of the substrate. For this reason, there has been a possibility that the above reaction between a substrate and a source material occurs, not only on the front surface of the substrate, but on all of the substrate surfaces which are exposed to the gas containing source materials.

Accordingly, a method has been proposed, in which a buffer layer is formed in advance on a substrate by a method other than the MOCVD method, followed by the introduction of this substrate on which the buffer layer is formed to an MOCVD reaction furnace (for example, refer to Patent Documents 3 and 4). In the method described in Patent Documents 3 and 4, the buffer layer is formed on the substrate through a reactive sputtering process, while as a substrate material, sapphire, silicon, silicon carbide, zinc oxide, gallium phosphide, gallium arsenide, magnesium oxide, manganese oxide, single crystals of a group III nitride based semiconductor, or the like, is used, and among them, a sapphire a-plane substrate is particularly suitable.

According to the above Patent Documents 3 and 4, since the buffer layer is favorably oriented due to the formation of the buffer layer by the process employing a reactive sputtering method, the crystallinity of the group III nitride semiconductor formed thereon is improved.

[Patent Document 1] Japanese Patent Publication No. 3026087
[Patent Document 2] Japanese Unexamined Patent Application, First Publication No. Hei 4-297023
[Patent Document 3] Japanese Patent Publication No. 3440873
[Patent Document 4] Japanese Patent Publication No. 3700492

However, as a result of intensive and extensive studies, the present inventors and others discovered that when a buffer layer made of the above materials is formed on the substrate surface using the method described in Patent Documents 1 and 2, there are limits in order to further improve the crystallinity of the gallium nitride based compound semiconductor formed thereon using the MOCVD method. It is assumed that this problem is due to the inclusion of amorphous and/or polycrystalline phases in the buffer layer when the method described in Patent Documents 1 and 2 is employed. Similarly, in a film forming method, which uses aluminum nitride deposited through a sputtering process as a buffer layer, like the method described in Patent Documents 3 and 4, there has been a problem in that no further improvements in the crystallinity can be achieved due to the difference between the lattice constant of the buffer layer and that of the gallium nitride layer.

SUMMARY OF THE INVENTION

The present invention is made in view of the above circumstances and its object is to provide a method for producing a group III nitride semiconductor light emitting device capable of growing a group III nitride semiconductor having a favorable level of crystallinity on a substrate with excellent productivity and also capable of producing a group III nitride semiconductor light emitting device with excellent light emitting properties; a group III nitride semiconductor light emitting device; and a lamp.

The present inventors completed the present invention as a result of intensive studies in order to solve the above problems.

That is, the present invention relates to the following aspects.

A first aspect is a method for producing a group III nitride semiconductor light emitting device which is a method for producing a group III nitride semiconductor light emitting device, in which a buffer layer composed of a group III nitride compound is laminated on a substrate and then an n-type semiconductor layer provided with an underlying layer, a light emitting layer, and a p-type semiconductor layer are sequentially laminated on the buffer layer, the method characterized by including: a step of forming the buffer layer having a composition of $Al_xGa_{1-x}N$ ($0 \leqq X < 1$) by activating, with plasma, and thereby reacting at least a metallic Ga source and a gas containing a group V element; and a step of forming the underlying layer on the buffer layer.

A second aspect is the method for producing a group III nitride semiconductor light emitting device according to the above first aspect characterized in that the underlying layer is formed by a metal organic chemical vapor deposition (MOCVD) method.

A third aspect is the method for producing a group III nitride semiconductor light emitting device according to the above first or second aspect characterized in that the buffer layer is formed using a reactive sputtering method.

A fourth aspect is the method for producing a group III nitride semiconductor light emitting device according to the above third aspect characterized in that the buffer layer is formed by a reactive sputtering method in which the gas containing the group V element is made to circulate inside a reactor.

A fifth aspect is the method for producing a group III nitride semiconductor light emitting device according to the above third or fourth aspect characterized in that the buffer layer is formed by a radio frequency (RF) sputtering method.

A sixth aspect is the method for producing a group III nitride semiconductor light emitting device according to the above fifth aspect characterized in that the buffer layer is formed by an RF sputtering method while moving a magnet of a cathode.

A seventh aspect is the method for producing a group III nitride semiconductor light emitting device according to the above third or fourth aspect characterized in that the buffer layer is formed by a direct current (DC) sputtering method.

An eighth aspect is the method for producing a group III nitride semiconductor light emitting device according to the above seventh aspect characterized in that the buffer layer is formed by a pulsed DC sputtering method.

A ninth aspect is the method for producing a group III nitride semiconductor light emitting device according to any one of the above first to eighth aspects characterized in that the buffer layer is formed so as to cover at least 90% of a surface of the substrate.

A tenth aspect is the method for producing a group III nitride semiconductor light emitting device according to any one of the above first to ninth aspects characterized in that the buffer layer is formed by making a temperature of the substrate within a range of from room temperature to 1,000° C.

An eleventh aspect is the method for producing a group III nitride semiconductor light emitting device according to the above tenth aspect characterized in that the buffer layer is formed by making a temperature of the substrate within a range of 200 to 800° C.

A twelfth aspect is the method for producing a group III nitride semiconductor light emitting device according to any one of the above first to eleventh aspects characterized in that the group V element is nitrogen and a nitrogen gas fraction in the gas when forming the buffer layer is within a range of 20 to 100%.

A thirteenth aspect is the method for producing a group III nitride semiconductor light emitting device according to any one of the above first to twelfth aspects characterized in that the buffer layer is produced inside a chamber of a film forming apparatus under a condition of an ultimate vacuum degree of $1.0 \times 10^{-3}$ Pa or less.

A fourteenth aspect is the method for producing a group III nitride semiconductor light emitting device according to the above thirteenth aspect characterized in that the buffer layer is produced inside a chamber of a film forming apparatus under a condition of an ultimate vacuum degree of $3.5 \times 10^{-5}$ Pa or less.

A fifteenth aspect is the method for producing a group III nitride semiconductor light emitting device according to the above thirteenth aspect characterized in that the buffer layer is produced inside a chamber of a film forming apparatus under a condition of an ultimate vacuum degree of $6.0 \times 10^{-6}$ Pa or less.

A sixteenth aspect is the method for producing a group III nitride semiconductor light emitting device according to any one of the above first to fifteenth aspects characterized in that a pressure inside a chamber of a film forming apparatus is not less than 0.3 Pa when forming the buffer layer.

A seventeenth aspect is the method for producing a group III nitride semiconductor light emitting device according to any one of the above first to sixteenth aspects characterized in that a film formation rate is within a range of 0.01 nm/s to 10 nm/s when forming the buffer layer.

An eighteenth aspect is a group III nitride semiconductor light emitting device which is a group III nitride semiconductor light emitting device, in which a buffer layer composed of a group III nitride compound is laminated on a substrate and then an n-type semiconductor layer provided with an underlying layer, a light emitting layer, and a p-type semiconductor layer are sequentially laminated on the buffer layer, the group III nitride semiconductor light emitting device characterized in that the buffer layer has a composition of $Al_xGa_{1-x}N$ ($0 \leqq X < 1$) obtained by activating, with plasma, and thereby reacting at least a metallic Ga source and a gas containing a group V element, and the underlying layer is formed on the buffer layer.

A nineteenth aspect is the group III nitride semiconductor light emitting device according to the above eighteenth aspect characterized in that the underlying layer is a film obtained by a metal organic chemical vapor deposition (MOCVD) method.

A twentieth aspect is the group III nitride semiconductor light emitting device according to the above eighteenth or nineteenth aspect characterized in that the buffer layer is formed by a reactive sputtering method.

A twenty first aspect is the group III nitride semiconductor light emitting device according to any one of the above eighteenth to twentieth aspects characterized in that the buffer layer is composed of GaN.

A twenty second aspect is the group III nitride semiconductor light emitting device according to any one of the above eighteenth to twenty first aspects characterized in that the substrate is composed of sapphire.

A twenty third aspect is the group III nitride semiconductor light emitting device according to any one of the above eighteenth to twenty second aspects characterized in that the buffer layer is formed so as to cover at least 90% of a surface of the substrate.

A twenty fourth aspect is the group III nitride semiconductor light emitting device according to any one of the above eighteenth to twenty third aspects characterized in that the substrate has a principal plane constituted of a plane, which is composed of a c-plane, and a plurality of convex portions formed on the c-plane, and the buffer layer is formed so as to cover the principal plane.

A twenty fifth aspect is the group III nitride semiconductor light emitting device according to the above twenty fourth aspect characterized in that the convex portions of the substrate have a base width within a range of 0.05 to 5 µm and a height within a range of 0.05 to 5 µm, and at the same time, the height is not less than ¼ of the base width and intervals between the convex portions adjacent to each other are 0.5 to 5 times as large as the base width.

A twenty sixth aspect is the group III nitride semiconductor light emitting device according to the above twenty fourth or twenty fifth aspect characterized in that the convex portions of the substrate have a form in which an outer shape thereof gradually becomes smaller towards an upper section.

A twenty seventh aspect is the group III nitride semiconductor light emitting device according to any one of the above twenty fourth to twenty sixth aspects characterized in that the convex portions of the substrate are formed into a substantially circular cone shape or a substantially polygonal pyramid shape.

A twenty eighth aspect is a group III nitride semiconductor light emitting device obtained by any one of the method of the above first to seventeenth aspects.

A twenty ninth aspect is a lamp including the group III nitride semiconductor light emitting device of any one of the above eighteenth to twenty eighth aspects.

According to the method of the present invention for producing a group III nitride semiconductor light emitting device, since it is a method in which a buffer layer is formed so as to have a composition of $Al_xGa_{1-x}N$ ($0 \leqq X < 1$) by activating, with plasma, and thereby reacting at least a metallic Ga source and a gas containing a group V element, and an underlying layer that constitutes an n-type semiconductor layer is then formed on the buffer layer, the buffer layer can be formed as a layer with favorable orientation and an underlying layer with a favorable level of crystallinity can be formed on the buffer layer. As a result, no lattice mismatch occurs between the substrate and a semiconductor layer composed of the group III nitride semiconductor. In addition, by forming the buffer layer so as to cover each of the substrate planes, it is possible to prevent the substrate from reacting with the source gas.

Therefore, a group III nitride semiconductor light emitting device which is excellent in terms of productivity and also has excellent light emitting properties can be obtained.

BRIEF DESCRIPTION OF THE DRAWINGS

FIG. 4A is a cross sectional diagram of a light emitting device in which a buffer layer and a semiconductor layer are formed on a substrate upper plane where convex portions are provided; FIG. 4B is a cross sectional diagram showing a lower layer portion in FIG. 4A in detail; and FIG. 4C is a perspective view showing a substrate form.

FIG. 5A is a cross sectional diagram showing a state where the buffer layer is provided only on the principal plane of the substrate; FIG. 5B is a cross sectional diagram showing a state where the buffer layer is provided on the principal plane and a side plane of the substrate; and FIG. 5C is a cross sectional diagram showing a state where the buffer layer is provided on the principal plane, the side plane, and a back plane of the substrate.

FIG. 8A is a graph showing the relationship between the X-ray rocking curve full width at half maximum of a (0002) plane of the buffer layer and that of the underlying layer; and FIG. 8B is a graph showing the relationship between the X-ray rocking curve full width at half maximum of a (10-10) plane of the buffer layer and that of the underlying layer.

DESCRIPTION OF THE REFERENCE SYMBOLS

1, 2: Group III nitride semiconductor light emitting device (light emitting device); 10: Laminated semiconductor; 11, 60: Substrate; 11a, 61: Upper plane; 62: Plane; 63: Convex portion; 12, 52: Buffer layer; 14, 54: n-type semiconductor layer; 14a, 54a: Underlying layer; 15, 55: Light emitting layer; 16, 56: p-type semiconductor layer; 20, 70: Semiconductor layer; 3: Lamp; 40: Film forming apparatus; 41: Chamber; 47: Target (sputtering target).

DETAILED DESCRIPTION OF THE INVENTION

Figure 1:
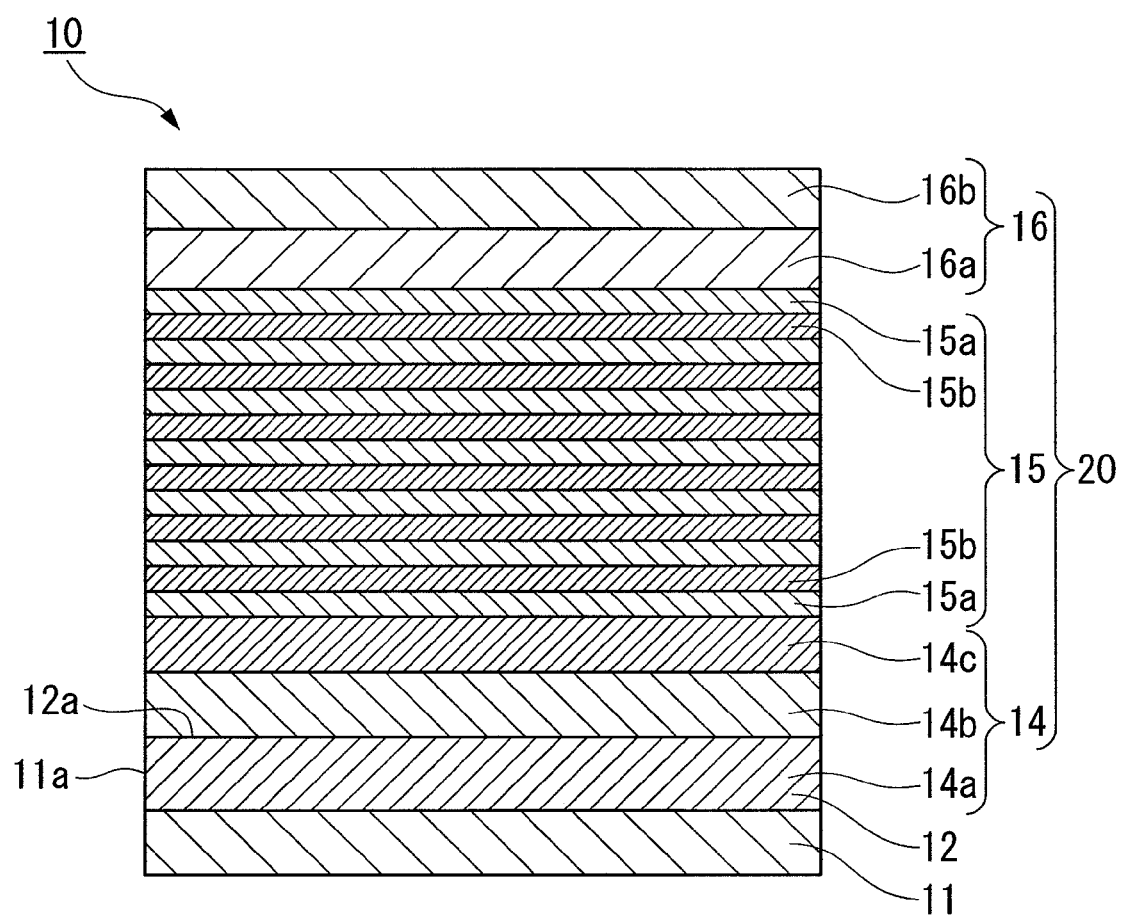
FIG. 1 is a diagram schematically describing one example of a group III nitride semiconductor light emitting device according to the present invention and is a schematic diagram showing a cross sectional structure of a laminated semiconductor.
Figure 2:
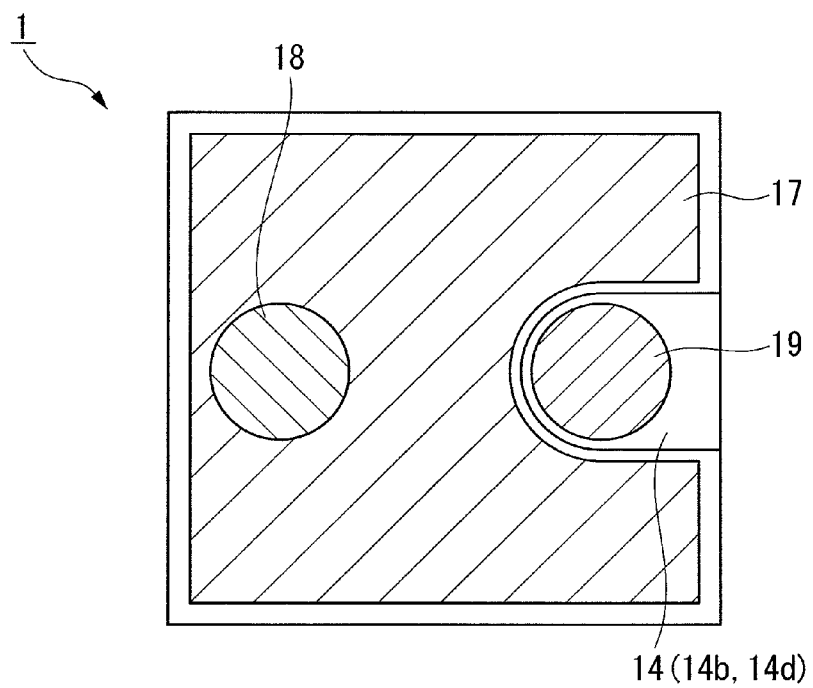
FIG. 2 is a diagram schematically describing one example of a group III nitride semiconductor light emitting device according to the present invention and is a schematic diagram showing a planar structure thereof.
Figure 3:
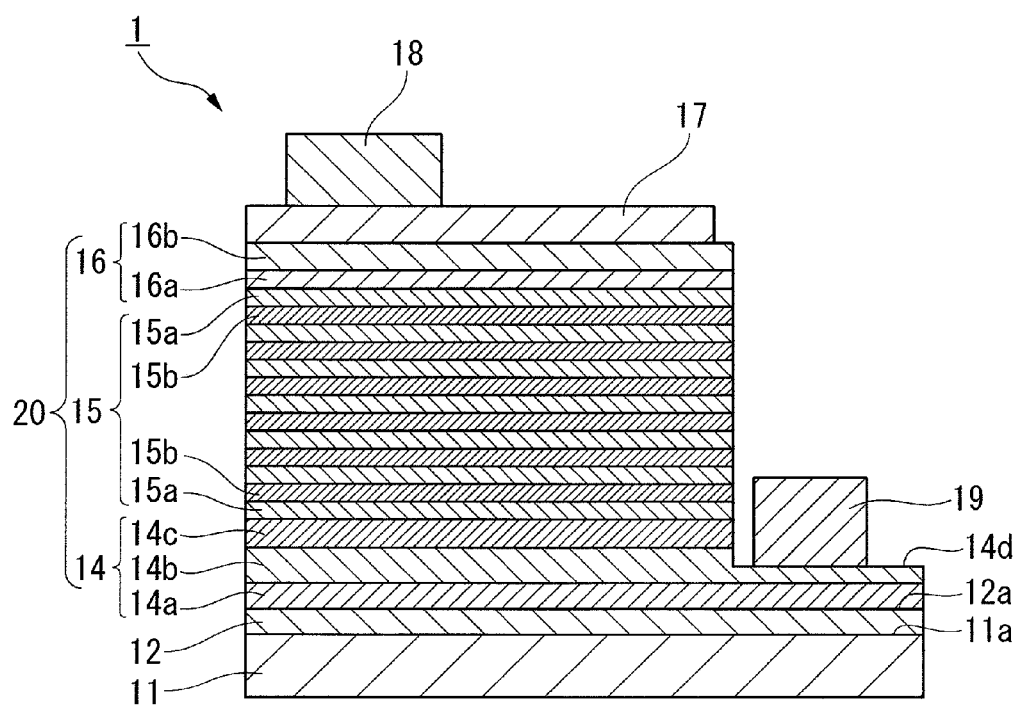
FIG. 3 is a diagram schematically describing one example of a group III nitride semiconductor light emitting device according to the present invention and is a schematic diagram showing a cross sectional structure thereof.
Figure 4A:
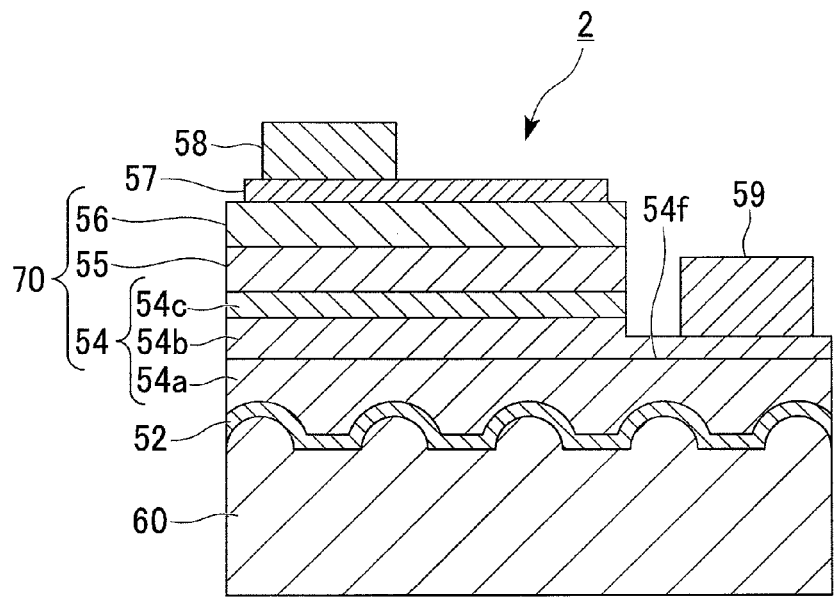
FIGS. 4A to 4C are diagrams schematically describing one example of a group III nitride semiconductor light emitting device according to the present invention.
Figure 4B:
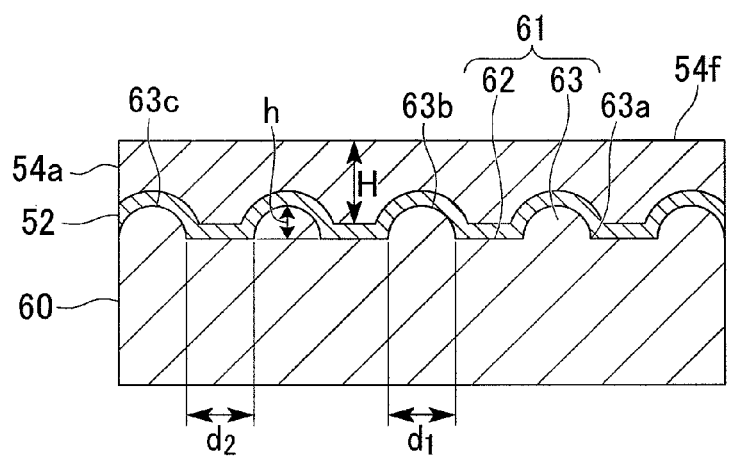
Figure 4C:
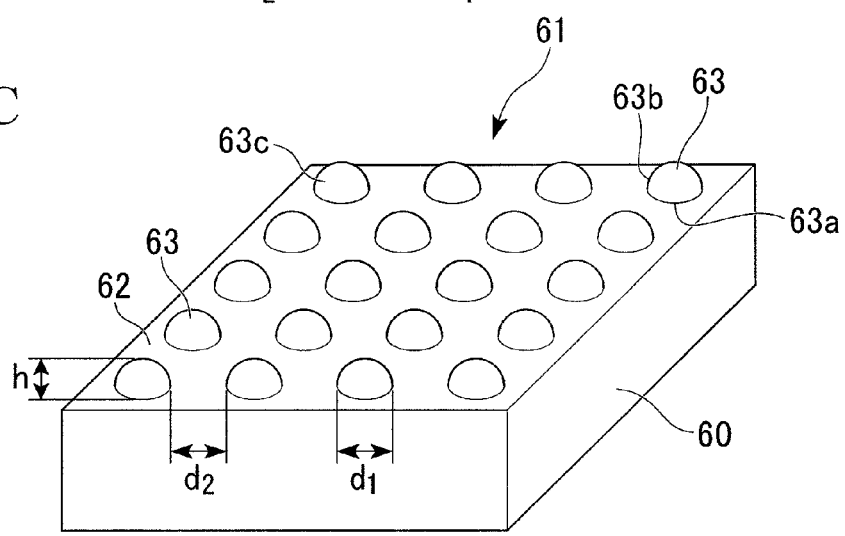
Figure 5A:
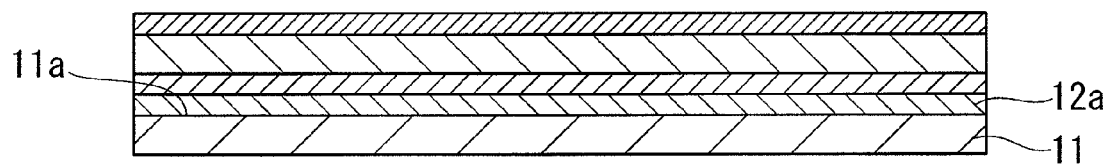
FIGS. 5A to 5C are diagrams schematically describing one example of a group III nitride semiconductor light emitting device according to the present invention.
Figure 5B:
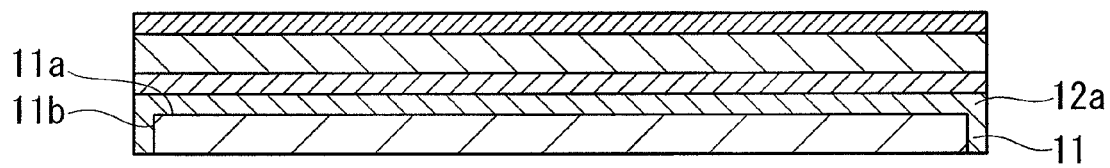
Figure 5C:
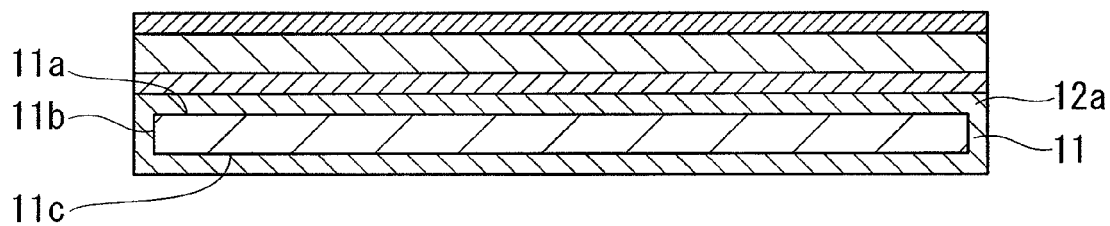
Figure 6:
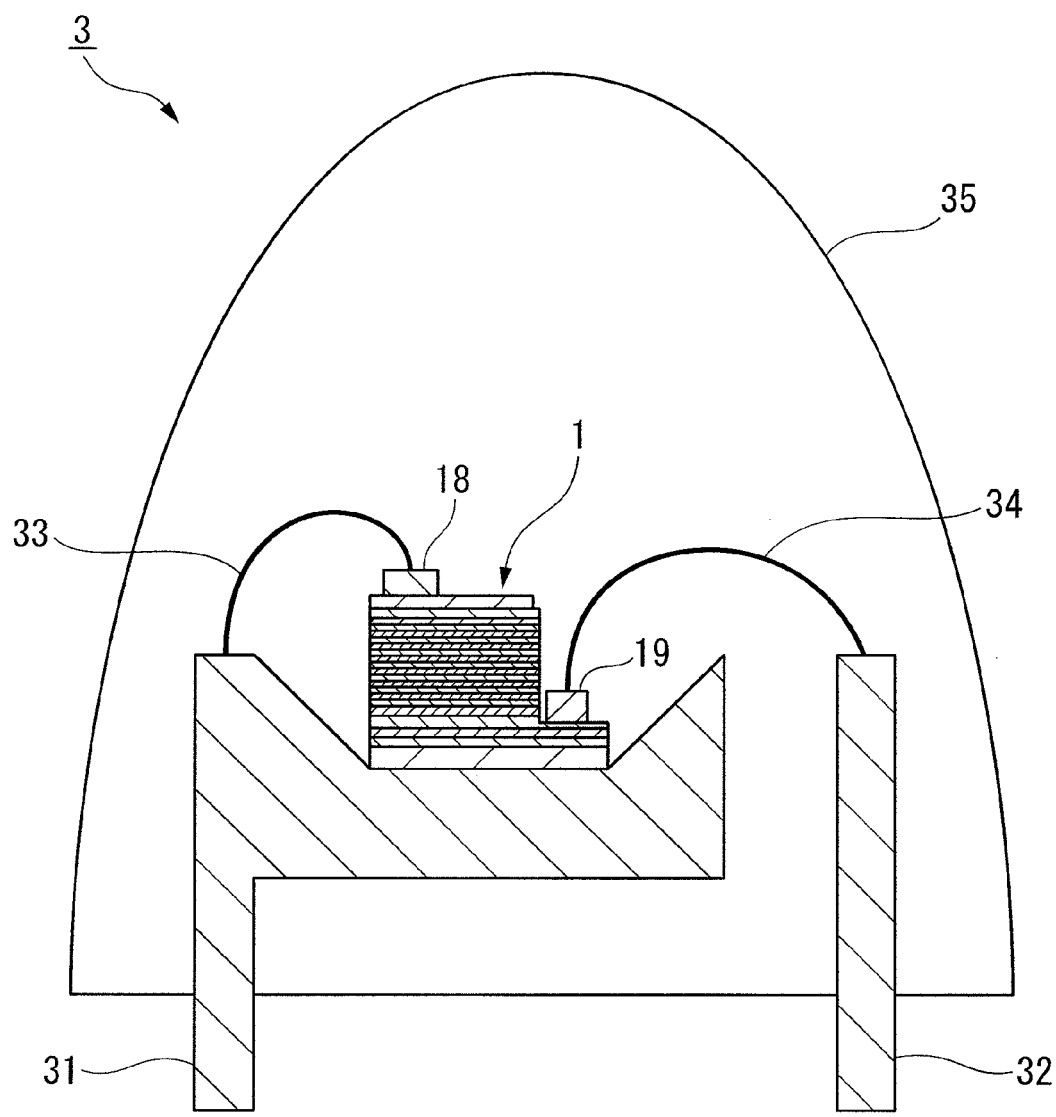
FIG. 6 is a diagram schematically describing a lamp that is constituted by using a group III nitride semiconductor light emitting device according to the present invention.
Figure 7:
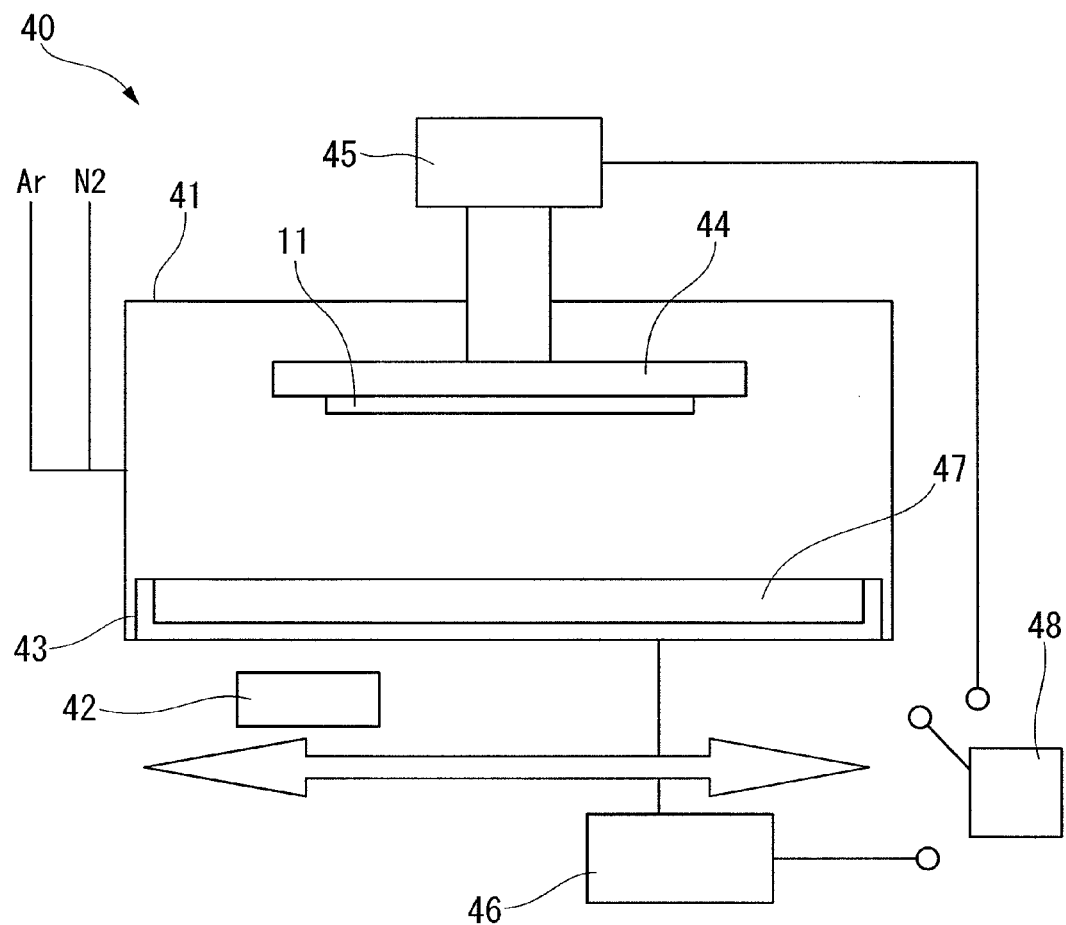
FIG. 7 is a diagram schematically describing one example of a method according to the present invention for producing a group III nitride semiconductor light emitting device and is a schematic diagram showing a structure of a sputtering apparatus in which a target is provided inside a chamber.

A method for producing a group III nitride semiconductor light emitting device, a group III nitride semiconductor light emitting device, and a lamp which are embodiments of the present invention will be described below while referring to FIGS. 1 to 7 where appropriate. FIG. 1 is a schematic cross sectional diagram showing one example of a laminated semiconductor provided in a group III nitride semiconductor light emitting device according to the present embodiment, FIG. 2 is a schematic plan view of the group III nitride semiconductor light emitting device, FIG. 3 is a schematic cross sectional view of the group III nitride semiconductor light emitting device, FIGS. 4A to 4C are schematic diagrams showing one example in which convex portions are provided on a substrate that constitutes the group III nitride semiconductor light emitting device, FIGS. 5A to 5C are schematic cross sectional views of a substrate in which a buffer layer is formed, FIG. 6 is a schematic cross sectional view of a lamp that is constituted by using the group III nitride semiconductor light emitting device according to the present embodiment, and FIG. 7 is a schematic diagram describing one example of a sputtering apparatus used in a production method according to the present embodiment. Note that the drawings referred to in the following explanations are diagrams for describing the group III nitride semiconductor light emitting device and the production method therefor according to the present embodiment as well as the lamp, and thus the dimensions of each components and sections such as the size, thickness, and so on are different from the dimensional relationships seen in the actual group III nitride semiconductor light emitting device and the like.

[One Example of Group III Nitride Semiconductor Light Emitting Device]

A group III nitride semiconductor light emitting device (hereinafter may be simply abbreviated as a "light emitting device") 1 according to the present embodiment is formed by laminating, on a substrate 11, a buffer layer 12 composed of a group III nitride compound, and by sequentially laminating, on the buffer layer 12, an n-type semiconductor layer 14 provided with an underlying layer 14a, a light emitting layer 15, and a p-type semiconductor layer 16. The buffer layer 12 has a composition of $Al_xGa_{1-x}N$ ($0 \leq X < 1$) attained by activating, with plasma, and thereby reacting at least a metallic Ga source and a gas containing a group V element, and the underlying layer 14a is formed on the buffer layer 12 in the construction.

<Laminate Structure of the Light Emitting Device>

FIG. 1 is a diagram for describing one example of a group III nitride semiconductor light emitting device according to the present invention, and is a cross sectional diagram showing a laminated semiconductor where a group III nitride semiconductor is formed on a substrate.

In the laminated semiconductor 10 shown in FIG. 1, the buffer layer 12 composed of a group III nitride compound is laminated on the substrate 11, and on the buffer layer 12, a semiconductor layer 20 is formed which is constituted by the sequential lamination of the n-type semiconductor layer 14 provided with the underlying layer 14a, the light emitting layer 15, and the p-type semiconductor layer 16.

Moreover, in the above laminated semiconductor 10, as exemplified in the plan view of FIG. 2 and the cross sectional view of FIG. 3, a transparent positive electrode 17 is laminated on the p-type semiconductor layer 16 and a positive electrode bonding pad 18 is further formed thereon, while a negative electrode 19 is laminated on an exposed area 14d that is formed in an n-type contact layer 14b of the n-type semiconductor layer 14, so as to configure the light emitting device 1 of the present embodiment. The laminate structure of the group III nitride semiconductor light emitting device according to the present embodiment will be described below in more detail.

[Substrate]

Sapphire is used as a material for the substrate 11 in the present embodiment.

In general, as a material for the substrate on which crystals of the group III nitride semiconductor are laminated, a substrate in which the crystals of the group III nitride semiconductor grow epitaxially is selected for use, and examples thereof include sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, and molybdenum. Among these materials, it is preferable to use a material having a hexagonal crystal structure, such as sapphire and SiC, from the view point that a group III nitride semiconductor with a favorable level of crystallinity can be laminated, and the use of sapphire is most preferable.

In addition, in terms of the size of the substrate, a substrate having a diameter of about 2 inches is commonly used. However, in the group III nitride semiconductor of the present invention, it is also possible to use a substrate having a diameter of 4 to 6 inches.

Note that when an oxide substrate, a metal substrate, or the like that is known to cause a chemical modification upon contact with ammonia at high temperatures is used among the above substrate materials, by forming a buffer layer without using the use of ammonia while forming an underlying layer that constitutes an n-type semiconductor layer described later with a method employing ammonia, the buffer layer of the present embodiment operates as a coating layer, and thus it is effective in preventing the chemical modification of the substrate. In addition, since it is generally possible to suppress the substrate temperature to a low level in the sputtering method, even when a substrate composed of a material that breaks down at high temperatures is used, it is possible to form each layer on the substrate 11 without damaging the substrate.

[Buffer Layer]

In the laminated semiconductor 10 of the present embodiment, the buffer layer 12 is provided on the substrate 11 made of sapphire. The buffer layer 12 has a composition of $Al_xGa_{1-x}N$ ($0 \leq X < 1$) achieved by a method in which a metallic Ga source and a gas containing a nitrogen element is activated with plasma, and can be formed, for example, by a reactive sputtering method. A film formed by the method employing a metallic source that is made into plasma, like the buffer layer 12 of the present embodiment, has an effect in that a favorable orientation can be readily attained.

(Crystal Structure)

In the present embodiment, by including Ga in the buffer layer, the lattice constant thereof can be made close to that of GaN. Due to this configuration, the difference between the above lattice constant and the lattice constant of the gallium nitride based compound semiconductor layer (refer to the underlying layer 14a provided in the n-type semiconductor layer 14 described later) formed by the MOCVD method will become small, and the crystallinity of this layer can be improved.

In addition, even among the materials containing Ga, by forming the buffer layer using GaN, it is also possible to make the buffer layer to have a lattice constant highly close to that of the gallium nitride based compound semiconductor layer situated above. However, due to the differences in the film forming temperature or the film thickness, the lattice constants of the two layers will not become completely the same.

(Component Composition)

The buffer layer 12 of the present embodiment is formed of a composition of $Al_xGa_{1-x}N$ ($0 \leq X < 1$) by activating, with plasma, and thereby reacting at least a metallic Ga source and a gas containing a group V element. In addition, other than the above composition, a group III nitride compound represented by the general formula AlGaInN or the like can also be used, and the composition containing As or P as the group V element can also be adopted. When the buffer layer is made to have a construction containing Ga as described above, it is preferable that the composition include not less than 50% of Ga.

In addition, as a material for constituting the buffer layer 12, a material having the same crystal structure as that of the group III nitride semiconductor that forms each of the layers constituting the semiconductor layer 20 can be used. However, a material having a length of the lattice which is close to that of the group III nitride semiconductor constituting the underlying layer described later is preferable, and a nitride of a group IIIA element in the periodic table is particularly suitable.

(Film Thickness)

The film thickness of the buffer layer 12 is preferably within a range of 5 to 500 nm. By making the film thickness of the buffer layer 12 within the above range, the buffer layer 12 can be obtained which has a favorable orientation and which effectively functions as a coating layer when forming each of the layers composed of a group III nitride semiconductor on the buffer layer 12.

When the film thickness of the buffer layer 12 is less than 10 nm, there is a possibility that the abovementioned function of the layer as the coating layer may not be favorable. On the other hand, if the buffer layer 12 is formed with a film thickness exceeding 500 nm, it is possible that its film forming process will require a long time, thereby lowering its productivity, although its function as a coating layer is not adversely affected. In addition, the film thickness of the buffer layer 12 is more preferably within a range of 10 to 100 nm.

(Coverage)

In the present embodiment, it is necessary that the buffer layer 12 covers not less than 60% of the overall principal plane 11a of the substrate 11, and preferably not less than 80%. It is preferable that the buffer layer 12 be formed so as to cover not less than 90% of the plane from the viewpoint of the layer function to coat the substrate 11. In addition, it is most preferable that the buffer layer 12 be formed so as to cover 100% of the principal plane 11a, that is, the entire principal plane 11a of the substrate 11 without a gap. When the area of the principal plane 11a of the substrate 11 covered by the buffer layer 12 becomes small, the substrate 11 is largely exposed and thus the buffer layer 12 does not function as a coating layer. As a result, a reaction takes place between a semiconductor source material that grows the crystals of the group III nitride semiconductor and the substrate, and the flatness of the underlying layer 14a which is formed on the buffer layer 12 may be impaired.

Note that when forming a buffer layer on the substrate 11, the buffer layer may be formed so as to only cover the principal plane 11a of the substrate 11, as the buffer layer 32a exemplified in FIG. 5A. However, the buffer layer may be formed so as to cover the principal plane 11a and a side plane 11b of the substrate 11, as the buffer layer 32b shown in FIG. 5B. In addition, it is most preferable to form a buffer layer so as to cover the principal plane 11a, the side plane 11b, and a back plane 11c of the substrate 11, as the buffer layer 32c shown in FIG. 5C from the viewpoint of the layer function as a coating layer.

As described above, in the MOCVD method employed in the film formation of the underlying layer 14a described later in detail, since it is possible that the source gas may flow to the side plane of the substrate and may even reach the back plane of the substrate, in order to prevent the reaction between the source gas and the substrate, it is most preferable to configure a buffer layer as the buffer layer 32c shown in FIG. 5C so that the side plane or the back plane of the substrate can also be protected.

[Semiconductor Layer]

As shown in FIG. 1, the laminated semiconductor 10 of the present embodiment is formed by the lamination, on the substrate 11 and via the abovementioned buffer layer 12, of the semiconductor layer 20 composed of a group III nitride based semiconductor and constituted of the n-type semiconductor layer 14 provided with the underlying layer 14a, the light emitting layer 15, and the p-type semiconductor layer 16. In addition, in the laminated semiconductor 10 in the illustrated example, the underlying layer 14a provided in the n-type semiconductor layer 14 is laminated on the buffer layer 12.

As the group III nitride semiconductors, various kinds of gallium nitride based compound semiconductors have been known which are represented by, for example, the general formula $Al_XGa_YIn_ZN_{1-A}M_A$ ($0 \leq X \leq 1$, $0 \leq Y \leq 1$, $0 \leq Z \leq 1$ and $X+Y+Z=1$. The letter M indicates a group V element which is different from nitrogen (N), and $0 \leq A < 1$). Also in the present invention, any kind of the gallium nitride based compound semiconductors represented by the general formula $Al_XGa_YIn_ZN_{1-A}M_A$ ($0 \leq X \leq 1$, $0 \leq Y \leq 1$, $0 \leq Z \leq 1$ and $X+Y+Z=1$. The letter M indicates a group V element which is different from nitrogen (N), and $0 \leq A < 1$) including those known gallium nitride based compound semiconductors can be used.

The gallium nitride based compound semiconductor can contain another group III element in addition to Al, Ga and In. Moreover, the gallium nitride based compound semiconductor can also contain elements such as Ge, Si, Mg, Ca, Zn, Be, P and As where necessary. Moreover, the elements contained are not limited to those added intentionally, and there are also cases where the semiconductor contain impurities that are inevitably contained depending on the film forming conditions and the like as well as the trace impurities contained in the source materials and the reaction tube materials.

[n-Type Semiconductor Layer]

The n-type semiconductor layer 14 is usually laminated on the buffer layer 12, and is constituted of the underlying layer 14a, an n-type contact layer 14b, and an n-type cladding layer 14c. Note that the n-type contact layer can also serve as the underlying layer and/or the n-type cladding layer, although the underlying layer can also serve as the n-type contact layer.

{Underlying Layer}

The underlying layer 14a of the present embodiment is composed of a group III nitride semiconductor and is formed by being laminated on the buffer layer 12 through a known metal organic chemical vapor deposition (MOCVD) method.

The material of the underlying layer 14a may not necessarily be the same material as that of the buffer layer deposited on the substrate 11, and different materials may be used. However, the underlying layer 14a is preferably constituted of an $Al_yGa_{1-y}N$ layer ($0 \leq y \leq 1$, preferably $0 \leq y \leq 0.5$, and more preferably $0 \leq y \leq 0.1$).

As a material used in the underlying layer 14a, a group III nitride compound containing Ga, in other words, a GaN based compound semiconductor is used, and in particular, AlGaN or GaN can be used suitably.

It is preferable to make the film thickness of the underlying layer 14a within a range of 0.1 to 8 µm from the viewpoint that an underlying layer with a favorable level of crystallinity can be obtained. It is more preferable to make the film thickness within a range of 0.1 to 2 µm from the viewpoint that the crystallinity of the underlying layer improves and also the time required for the film forming process can be shortened leading to an improved productivity.

The underlying layer 14a may be doped with an n-type impurity at a concentration within a range of $1\times10^{17}$ to $1\times10^{19}/cm^3$ if required. However, the underlying layer 14a may be undoped ($<1\times10^{17}/cm^3$). It is preferable that the underlying layer 14a be undoped in view of the maintenance of a favorable level of crystallinity. When the substrate 11 is conductive, the underlying layer 14a may be doped with a dopant to impart conductivity thereto so that an electrode can be formed above and below the light emitting device. On the other hand, when an insulative material is used as the substrate 11, since the light emitting device will have a chip structure in which a positive electrode and a negative electrode are provided on the same plane, the underlying layer 14a is preferably formed into undoped crystals because the crystallinity thereof will be favorable. Although there is no particular limitation on the n-type impurities, examples thereof include Si, Ge, and Sn, and Si, and Ge are preferable.

{n-Type Contact Layer}

The n-type contact layer 14b of the present embodiment is composed of a group III nitride semiconductor, and is formed by being laminated on the underlying layer 14a through an MOCVD method or a sputtering method.

It is preferable that the n-type contact layer 14b be constituted from an $Al_xGa_{1-x}N$ layer ($0\leq x\leq 1$, preferably $0\leq x\leq 0.5$, and more preferably $0\leq x\leq 0.1$) in a similar manner to that in the underlying layer 14a. In addition, it is preferable that the n-type contact layer 14b be doped with n-type impurities. It is preferable that the n-type contact layer 14b contain n-type impurities at a concentration of $1\times10^{17}$ to $1\times10^{19}/cm^3$, and more preferably $1\times10^{18}$ to $1\times10^{19}/cm^3$ from the viewpoints of the maintenance of a favorable level of ohmic contact with a negative electrode, the prevention of the occurrence of cracking, and the maintenance of a favorable level of crystallinity. Although there is no particular limitation on the n-type impurities, examples thereof include Si, Ge, and Sn, and Si and Ge are preferable. In addition, the growth temperature of the n-type contact layer can be set to the same growth temperature as that of the underlying layer. Moreover, as described above, the n-type contact layer 14b can also be configured so as to include the underlying layer.

It is preferable that the group III nitride semiconductors that constitute the underlying layer 14a and the n-type contact layer 14b have the same composition. The total thickness of these layers may be within a range of 0.1 to 20 µm, preferably within a range of 0.5 to 15 µm, and more preferably within a range of 1 to 12 µm. When the total thickness is within such a range, a favorable level of crystallinity of the semiconductor can be maintained.

{n-Type Cladding Layer}

It is preferable that the n-type cladding layer 14c be provided between the abovementioned n-type contact layer 14b and the light emitting layer 15 described later in detail. By providing the n-type cladding layer 14c, the deterioration in the flatness of the outermost surface of the n-type contact layer 14b can be alleviated. The n-type cladding layer 14c can be formed from AlGaN, GaN, GaInN, or the like through the use of an MOCVD method or the like. In addition, the n-type cladding layer may have a superlattice structure in which the above structures are laminated several times. Needless to say, when forming the n-cladding layer 14c with GaInN, it is desirable that its bandgap is larger than that of GaInN in the light emitting layer 15.

Although there is no particular limitation on the film thickness of the n-type cladding layer 14c, it is preferably within a range of 5 to 500 nm and more preferably within a range of 5 to 100 nm.

In addition, the n-type dopant concentration of the n-type cladding layer 14c is preferably within a range of $1\times10^{17}$ to $1\times10^{20}/cm^3$, and more preferably within a range of $1\times10^{18}$ to $1\times10^{19}/cm^3$. When the dopant concentration is within the above range, it is preferable from the viewpoints of the maintenance of a favorable level of crystallinity and the reduction in the operating voltage of a light emitting device.

Note that when the n-type cladding layer 14c is made into a layer containing a superlattice structure, although a detailed illustration is omitted, the layer may include a laminated structure composed of an n-side first layer formed of a group III nitride semiconductor having a film thickness of not more than 100 Angstroms, and an n-side second layer having a different composition from that of the n-side first layer and formed of a group III nitride semiconductor having a film thickness of not more than 100 Angstroms. In addition, the n-type cladding layer 14c may also be a layer including a structure in which the n-side first layer and the n-side second layer are laminated repeatedly in an alternating arrangement. Moreover, it is preferable to adopt a configuration such that any one of the n-side first layer and the n-side second layer is brought into direct contact with the light emitting layer 15.

The n-side first layer and n-side second layer as described above can adopt a composition of, for example, an AlGaN based composition containing Al (hereinafter may be simply described as AlGaN), a GaInN based composition containing In (hereinafter may be simply described as GaInN), or GaN. In addition, the n-side first layer and n-side second layer may also be formed as an alternating structure of GaInN/GaN, an alternating structure of AlGaN/GaN, an alternating structure of GaInN/AlGaN, an alternating structure of GaInN/GaInN with different compositions (the description "with different compositions" used in the present invention refers to a situation where the composition ratio of each elements differ, and the same applies hereinafter), and an alternating structure of AlGaN/AlGaN with different compositions. In the present invention, the n-side first layer and n-side second layer preferably have either an alternating structure of GaInN/GaN or an alternating structure of GaInN/GaInN with different compositions.

The superlattice layers of the above n-side first layer and the n-side second layer are both preferably not more than 60 Angstroms, are both more preferably not more than 40 Angstroms, and are both most preferably within a range of 10 to 40 Angstroms. When the film thickness of the n-side first layer and n-side second layer that form the superlattice layer exceed 100 Angstroms, then the layer tends to contain many crystal defects, which is undesirable.

The above n-side first layer and the n-side second layer may each have doped structures, or may have a combination of a doped structure and an undoped structure. As an impurity to be doped, any of the conventional impurities used for doping the above material compositions can be used without any particular limitations. For example, in those cases where an alternating structure of GaInN/GaN or an alternating structure of GaInN/GaInN having a different composition for each layer is used as the n-type cladding layer, Si is preferred as the impurity. In addition, the abovementioned n-side superlattice multilayer film may be prepared with doping switched appropriately ON and OFF, even if the composition such as GaInN, AlGaN or GaN is the same.

[Light Emitting Layer]

The light emitting layer 15 is the layer that is laminated onto the n-type semiconductor layer 14, and onto which is then laminated the p-type semiconductor layer 16. The light emitting layer 15 can be formed by employing a known MOCVD method or the like. In addition, as shown in FIG. 1, the light emitting layer 15 is formed by the alternate and repeated lamination of a barrier layer 15a composed of a gallium nitride based compound semiconductor, and a well layer 15b composed of a gallium nitride based compound semiconductor containing indium. In the illustrated example, the light emitting layer 15 is formed by the lamination of the above two layers in the order so that the barrier layer 15a is disposed at both sides adjacent to the n-type semiconductor layer 14 and the p-type semiconductor layer 16.

As the barrier layer 15a, for example, a gallium nitride based compound semiconductor such as $Al_cGa_{1-c}N$ ($0 \leq c<0.3$) can be used favorably which has a larger band gap energy than that of the well layer 15b composed of a gallium nitride based compound semiconductor that contains indium.

In addition, as the well layer 15b, for example, a gallium indium nitride such as $Ga_{1-s}In_sN$ ($0<s<0.4$) can be used as a gallium nitride based compound semiconductor that contains indium.

Further, there is no particular limitation on the film thickness of the light emitting layer 15 as a whole. For example, the film thickness of the light emitting layer 15 is preferably within a range of 1 to 500 nm, and the film thickness of about 100 nm is more preferable. When the film thickness is within the above range, this contributes to the improvement of light emission output.

[p-Type Semiconductor Layer]

The p-type semiconductor layer 16 is usually composed of a p-type cladding layer 16a and a p-type contact layer 16b, and is formed through a deposition process using an MOCVD method or a reactive sputtering method. In addition, the p-type contact layer may also function as a p-type cladding layer.

The p-type semiconductor layer 16 of the present embodiment is formed by adding p-type impurities thereto in order to control the electrical conductivity thereof to p-type electrical conductivity. There is no particular limitation on the p-type impurities. However, the use of Mg is preferable, and Zn can also be used in a similar manner.

In addition, there are no particular limitations on the film thickness of the p-type semiconductor layer 16 as a whole. However, it is preferably within a range of 0.05 to 1 μm.

{p-Type Cladding Layer}

Although there are no particular limitations on the p-type cladding layer 16a, provided it has a composition that exhibits a larger band gap energy than that of the light emitting layer 15 and is capable of confining a carrier in the light emitting layer 15, examples of preferred layers include those formed of $Al_dGa_{1-d}N$ (wherein $0<d \leq 0.4$, and preferably $0.1 \leq d \leq 0.3$). It is preferable that the p-type cladding layer 16a be composed of this type of AlGaN in terms of confining a carrier in the light emitting layer 15.

There are no particular limitations on the film thickness of the p-type cladding layer 16a. However, it is preferably within a range of 1 to 400 nm, and more preferably within a range of 5 to 100 nm.

The p-type dopant concentration within the p-type cladding layer 16a which is achieved by the addition of p-type impurities is preferably within a range of $1 \times 10^{18}$ to $5 \times 10^{21}$/cm$^3$, and more preferably within a range of $1 \times 10^{19}$ to $5 \times 10^{20}$/cm$^3$. A p-type dopant concentration within the above range enables a favorable p-type crystal to be obtained with no deterioration in crystallinity.

In addition, similar to the abovementioned n-type cladding layer 14c, the p-type cladding layer 16a of the present embodiment may also be formed as a superlattice structure having a plurality of laminated layers. In those cases where the p-type cladding layer 16a incorporates a superlattice structure, although not shown in detail in the drawings, the layer may include a laminated structure composed of a p-side first layer formed of a group III nitride semiconductor having a film thickness of not more than 100 Angstroms, and a p-side second layer having a different composition from that of the p-side first layer and formed of a group III nitride semiconductor having a film thickness of not more than 100 Angstroms. In addition, the p-type cladding layer 16a may also be a layer including a structure in which the p-side first layer and the p-side second layer are laminated repeatedly in an alternating arrangement.

The abovementioned p-side first layer and p-side second layer may be formed, for example, from any one of AlGaN, GaInN and GaN, with a different composition for each layer. In addition, the p-side first layer and p-side second layer may also be formed as an alternating structure of GaInN/GaN, an alternating structure of AlGaN/GaN, or an alternating structure of GaInN/AlGaN. In the present invention, the p-side first layer and the p-side second layer preferably have either an AlGaN/AlGaN structure, or an AlGaN/GaN alternating structure.

The superlattice layers of the above p-side first layer and the p-side second layer are preferably both not more than 60 Angstroms, are more preferably both not more than 40 Angstroms, and are most preferably both within a range of 10 to 40 Angstroms. When the film thickness of the p-side first layer and p-side second layer that form the superlattice layer exceed 100 Angstroms, then the layer tends to contain many crystal defects, which is undesirable.

The above p-side first layer and the p-side second layer may each have doped structures, or may have a combination of a doped structure and an undoped structure. As an impurity to be doped, any of the conventional impurities used for doping the above material compositions can be used without any particular limitations. For example, in those cases where an alternating structure of AlGaN/GaN or an alternating structure of AlGaN/AlGaN having a different composition for each layer is used as the p-type cladding layer, Mg is preferred as the impurity. In addition, the abovementioned p-side superlattice multilayer film may be prepared with doping switched appropriately ON and OFF, even if the composition such as GaInN, AlGaN or GaN is the same.

{p-Type Contact Layer}

The p-type contact layer 16b is a gallium nitride based compound semiconductor layer that contains at least $Al_eGa_{1-e}N$ (where $0 \leq e<0.5$, preferably $0 \leq e \leq 0.2$, and more preferably $0 \leq e \leq 0.1$). An Al composition within the above range is preferred in terms of maintaining a favorable level of crystallinity, and achieving a favorable ohmic contact with a p-ohmic electrode (refer to a transparent electrode 17 described later).

There are no particular limitations on the film thickness of the p-type contact layer 16b. However, the thickness of the p-type contact layer 16b is preferably within a range of 10 to 500 nm, and more preferably within a range of 50 to 200 nm. It is preferable that the film thickness be within this range from a viewpoint of light emission output.

In addition, when the p-type dopant concentration achieved by adding p-type impurities to the p-type contact layer 16b is within a range of $1 \times 10^{18}$ to $1 \times 10^{21}$/cm$^3$, it is preferable in terms of maintaining a favorable ohmic contact, preventing the occurrence of cracking, and maintaining a favorable level of crystallinity. The p-type dopant concentration is more preferably within a range of $5 \times 10^{19}$ to $5 \times 10^{20}$/cm$^3$.

In the present embodiment, as described above, on the buffer layer 12 having a composition of $Al_xGa_{1-x}N$ (where $0 \leq X < 1$) achieved by reacting at least a metallic Ga source and a gas containing a group V element that are activated with plasma, an underlying layer 14a obtained by a metal organic chemical vapor deposition (MOCVD) method is provided. By adopting a configuration in which the underlying layer 14a with an excellent crystallinity is provided on the buffer layer 12 that is oriented favorably as described above, the crystallinity of each of the layers that are further formed on the underlying layer 14a and constitute the semiconductor layer 20 will also become excellent. Therefore, it is possible to achieve a group III nitride semiconductor light emitting device having excellent light emitting properties.

[Transparent Positive Electrode]

The transparent positive electrode 17 is an electrode having translucency that is formed on top of the p-type semiconductor layer 16 (in other words, on the p-type contact layer 16b) in the abovementioned laminated semiconductor 10.

There are no particular limitations on the material used for the transparent positive electrode 17, and by using materials such as ITO ($In_2O_3$—$SnO_2$), AZO ($ZnO$–$Al_2O_3$), IZO ($In_2O_3$—$ZnO$), and GZO ($ZnO$—$Ga_2O_3$), the transparent positive electrode 17 can be formed through a conventional means well known in this technical field. In addition, also in terms of the structure thereof, any structure may be used without any particular limitations, including any of the conventionally known structures.

Further, the transparent positive electrode 17 may be formed so as to cover almost the entire surface of the p-type semiconductor layer 16 in which Mg is doped, or may be formed in a lattice shape or a branched shape with gaps therein.

[Positive Electrode Bonding Pad and Negative Electrode]

A positive electrode bonding pad 18 is an electrode formed on the abovementioned transparent positive electrode 17.

As the material for the positive electrode bonding pad 18, various structures using Au, Al, Ni, Cu, and the like are well known, and any of these known materials or structures can be used without any limitations.

It is preferable that the thickness of the positive electrode bonding pad 18 be within a range of 100 to 1000 nm. In addition, in terms of the bonding pad properties, a larger thickness yields superior bondability, and therefore the thickness of the positive electrode bonding pad 18 is more preferably not less than 300 nm. Moreover, from the viewpoint of production costs, the thickness is preferably not more than 500 nm.

In the semiconductor layer in which the n-type semiconductor layer 14, the light-emitting layer 15, and the p-type semiconductor layer 16 are sequentially laminated on the substrate 11, a negative electrode 19 is formed so as to contact the n-type contact layer 14b of the n-type semiconductor layer 14.

For this reason, when forming the negative electrode 19, a portion of the p-type semiconductor layer 16, the light emitting layer 15, and the n-type semiconductor layer 14 is first removed to expose the n-type contact layer 14b and thereby forming an exposed area 14d, and the negative electrode 19 is then formed on the exposed area 14d.

As the material for the negative electrode 19, negative electrodes of various compositions and structures are already well known, and any of these known negative electrodes can be used without any particular limitations. The negative electrode 19 can be formed through a conventional means well known in this technical field.

According to the group III nitride semiconductor light emitting device 1 of the present embodiment as described so far, since it is configured so that the buffer layer 12 formed on the substrate 11 has a composition of $Al_XGa_{1-X}N$ ($0 \leq X < 1$) that is achieved by activating at least a metallic Ga source and a gas containing a group V element with plasma, and the underlying layer 14a is formed on the buffer layer 12, the buffer layer 12 will become a film with a favorable orientation and the underlying layer 14a formed thereon will be a film with an excellent level of crystallinity. Due to this configuration, since each of the n-type semiconductor layer 14, the light emitting layer 15, and the p-type semiconductor layer 16 that constitute the semiconductor layer 20 will become layers having an excellent level of crystallinity, a light emitting device with excellent light emitting properties can be achieved.

[One Example of Method for Producing Group III Nitride Semiconductor Light Emitting Device]

A method for producing a group III nitride semiconductor light emitting device according to the present embodiment is a method in which the buffer layer 12 composed of a group III nitride compound is laminated on the substrate 11 and then the n-type semiconductor layer 14 provided with the underlying layer 14a, the light emitting layer 15, and the p-type semiconductor layer 16 are sequentially laminated on the buffer layer 12, and is a method in which the buffer layer 12 is formed so as to have a composition of $Al_XGa_{1-X}N$ ($0 \leq X < 1$) by activating, with plasma, and thereby reacting at least a metallic Ga source and a gas containing a group V element, and the underlying layer 14 is formed on the buffer layer 12.

In the production method of the present embodiment, the crystals of a group III nitride semiconductor is grown epitaxially on the substrate 11, and when forming the laminated semiconductor 10 as shown in FIG. 1, the buffer layer 12 is formed on the substrate 11 followed by the formation of the semiconductor layer 20 thereon. In the method of the present embodiment, the buffer layer 12 is formed from GaN through a reactive sputtering method in which a metallic Ga source and a gas containing a nitrogen element are activated with plasma, and then the underlying layer 14a that constitutes the n-type semiconductor layer 14 is formed thereon through an MOCVD method, followed by the respective formation of the n-type contact layer 14b, the n-type cladding layer 14c, the light emitting layer 15, and the p-type semiconductor layer 16 through an MOCVD method.

Additionally, in the production method of the present embodiment, as exemplified in the plan view in FIG. 2 and in the cross sectional view in FIG. 3, the transparent positive electrode 17 is laminated on the p-type semiconductor layer 16 of the laminated semiconductor 10 and a positive electrode bonding pad 18 is formed thereon, while the negative electrode 19 is laminated on the exposed area 14d formed in the n-type contact layer 14b of the n-type semiconductor layer 14, as a result of which the light emitting device 1 is attained.

The method for producing a group III nitride semiconductor light emitting device according to the present embodiment will be described below in more detail.

[Formation of Buffer Layer]

In the present embodiment, a method is adopted in which the buffer layer 12 is formed so as to have a composition of $Al_XGa_{1-X}N$ ($0 \leq X < 1$) by activating, with plasma, and thereby reacting at least a metallic Ga source and a gas containing a group V element, and the buffer layer 12 is formed under the conditions and through the procedures which will be described in detail below.

[Pretreatment of Substrate]

In the present embodiment, it is desirable to subject the substrate 11 to a pretreatment employing a sputtering method or the like prior to formation of the buffer layer 12 thereon. Specifically, the substrate surface can be cleaned by exposing the substrate 11 to an Ar or N$_2$ plasma. For example, through a reverse sputtering process in which the surface of the substrate 11 is treated with a plasma of Ar gas or N$_2$ gas or the like, any organic material or oxides adhered to the surface of the substrate 11 can be removed. In such a case, when a voltage is applied between the substrate 11 and a chamber, then the plasma particles will act efficiently on the substrate 11. By subjecting the substrate 11 to a pretreatment as described above, the buffer layer 12 can be formed all over the principal plane 11a of the substrate 11, and the crystallinity of the film further deposited thereon can be improved.

In addition, it is more preferable to subject the substrate 11 to a wet pretreatment prior to the pretreatment by the reverse sputtering process as described above.

In addition, it is preferable to conduct a pretreatment of the substrate 11 through a plasma treatment, as the reverse sputtering process described above, which is carried out in an atmosphere where ionic components and radical components with no electric charge are mixed.

Note here that when, for example, ionic components or the like are solely supplied to the substrate surface during the removal of contaminants and the like from the substrate surface, a problem arises in that the resulting energy will be too intensive and thereby damaging the substrate surface, as a result of which the quality of the crystals grown on the substrate will decline. In the present embodiment, it is possible to carry out the removal of contaminants and the like without causing damage to the surface of the substrate 11 by employing, as the pretreatment of the substrate 11, a plasma treatment conducted in an atmosphere where ionic components and radical components are mixed as described above, and thereby supply reactive species having an adequate energy level to the substrate 11. It is considered that the mechanism capable of achieving such effects is due to the suppression of possible damages caused on the substrate surface by the use of plasma having a low proportion of ionic components, the effective removal of contaminants by the provision of plasma to the substrate surface, or the like.

[Formation of Buffer Layer by Plasma Activation]

In the present embodiment, as described above, a method is adopted in which the buffer layer 12 is formed so as to have a composition of $Al_xGa_{1-x}N$ ($0 \leqq X<1$) by activating, with plasma, and thereby reacting at least a metallic Ga source and a gas containing a group V element, and in the present example, a method is adopted in which the buffer layer 12 is formed by employing a reactive sputtering process in which a high voltage is applied for discharge at a specified degree of vacuum. As a formation method described above in which a metallic material and a source gas are activated with plasma and are thereby reacted, in addition to the reactive sputtering process, for example, a pulsed laser deposition (PLD) method in which plasma is generated by irradiating laser with a high energy density, a pulsed electron beam deposition (PED) method in which plasma is generated by irradiating electron beam, or the like may be exemplified and can be selected for use where appropriate. However, the reactive sputtering method is preferable since it is the simplest method and is also suited for mass production.

In the present embodiment, after conducting a pretreatment on the surface of the substrate 11 through the above-mentioned process, the substrate 11 is heated to about 500° C. by placing the substrate 11 inside a chamber 41 of a sputtering apparatus 40 (refer to FIG. 7) and introducing a nitrogen-containing gas, which is a gas containing a group V element, into the chamber 41. Subsequently, a high frequency bias is applied to the substrate 11 side, and at the same time, plasma is generated inside the chamber 41 by applying power to a Ga target side in which metallic Ga is used as a group III metal material, and the buffer layer 12 composed of GaN is formed on the substrate 11 while holding the pressure inside the chamber 41 at a constant level.

(Sputtering Apparatus: Film Forming Apparatus)

In the sputtering apparatus 40 shown in the example of FIG. 7, a magnet 42 is placed below a target 47 containing a metallic material (that is, a sputtering target) at a lower section in FIG. 7, and the magnet 42 is swung below the target 47 by a drive apparatus which is not shown. Nitrogen gas and argon gas are fed to the chamber 41, and a buffer layer is deposited on the substrate 11 that is attached to a heater 44. During this process, since the magnet 42 is swung below the target 47 as described above, the plasma confined inside the chamber 41 moves around. As a result, it will be possible to form a buffer layer evenly not only on the principal plane 11a of the substrate 11 but also on a side plane thereof.

Examples of the reactive sputtering methods for depositing the buffer layer 12 include a radio frequency (RF) sputtering method and a direct current (DC) sputtering method. Note here that when a deposition process for forming a film is conducted by employing a reactive sputtering method as in the production method according to the present invention and also using nitrogen gas as a gas containing a group V element, it is known that nitrogen adsorbs to the surface of a target (metallic material) (refer to Mat. Res. Soc. Symp. Proc., Vol. 68, pp. 357, 1986). In general, when conducting a film forming process through a sputtering method using a metallic material as a target, it is preferable to employ a DC sputtering method in terms of film forming efficiency. However, in the DC sputtering method where continuous discharge takes place, nitrogen adheres to the target causing charge-up of the target surface and the film formation rate may become unstable. For this reason, in the production method according to the present invention, the use of an RF sputtering method or a pulsed DC sputtering method where, among the DC sputtering methods, a pulsed bias can be provided, is preferred. In addition, it is preferable to use a sputtering apparatus which is capable of conducting such sputtering methods.

Further, when forming the buffer layer 12 by the sputtering method, it is more preferable to carry out the film forming process by employing a reactive sputtering method in which a gas containing nitrogen is circulated inside a reactor, since a favorable level of crystallinity can be retained by controlling the reaction and this favorable level of crystallinity can be attained stably with a high level of reproducibility. Additionally, it is preferable to adopt a sputtering apparatus which is capable of conducting such a reactive sputtering method.

Moreover, as a method in order to avoid the charging up at the time of sputter deposition process, it is preferable to move the position of the magnet within the target. The specific method of moving the magnet may be selected in accordance with the sputtering apparatus being used, and may be either swung or rotated. In the sputtering apparatus 40 exemplified in FIG. 7, it is configured so that the magnet 42 is provided below the target 47 and the magnet 42 is rotatable below the target 47.

In addition, in the reactive sputtering method, a technique for improving efficiency by confining plasma within a magnetic field is commonly employed. At the time of employing this method, in order to use the target evenly without any bias, it is preferable to use an apparatus, as the sputtering apparatus 40 described above, that adopts an RF sputtering method in which a deposition process is conducted while moving the position of the magnet 42 of a cathode within the target 47. Such an RF sputtering method in which a film forming process is conducted while swinging or rotating the magnet of a cathode is suitable in terms of the film forming efficiency at the time of forming the buffer layer on the side plane of the substrate 11 which will be described later in detail.

In addition, although it will be described later in detail, it is preferable that the amount of impurities remaining inside the chamber 41 be as small as possible, and it is particularly preferable to reduce the impurities adhering to the inner wall of the chamber 41 as much as possible. For this reason, it is preferable that the ultimate vacuum degree inside the chamber 41 which will be determined based on the performance of the sputtering apparatus 40 be not more than $1.0 \times 10^{-3}$ Pa.

Moreover, it is preferable that the buffer layer 12 be formed so as to cover at least 90% of the principal plane 11a of the substrate 11, more preferably the buffer layer 12 is formed so as to cover the side plane of the substrate 11, and most preferably the buffer layer 12 is formed so as to cover the side plane and the back plane of the substrate 11. However, when a buffer layer is formed even on the side plane or the back plane of a substrate by employing a conventional sputtering apparatus and a film forming method, it is necessary to conduct a film forming process from about 6 times up to a maximum of 8 times, and thus the process will become a time consuming step. Examples of the possible film forming methods other than the abovementioned film forming method include a method in which a film is formed all over the substrate plane by placing the substrate inside a chamber without being held. However, when there is a need to heat the substrate, it is possible that an apparatus used will become complex. Accordingly, by using, for example, a sputtering apparatus capable of swinging or rotating a substrate, it is possible to carry out a film forming process while changing the position of the substrate with respect to the sputtering direction of a film forming material. By adopting such a sputtering apparatus as well as a film forming process, it is possible to form a film on the principal plane and the side plane of a substrate in just one step. Moreover, by subsequently carrying out a film forming process on the back plane of the substrate, it is possible to cover the entire plane of the substrate with the deposited film in just a total of two steps.

In addition, a sputtering apparatus may adopt a configuration in which a source material that forms a film is generated from a source (target) having a large area, and also in which a film can be formed all over the substrate plane without moving the substrate by moving the position where the film forming material is generated. One example of such an apparatus include an apparatus employing an RF sputtering method in which a film forming process is carried out while the position of a magnet of a cathode is moved within a target by swinging or rotating the magnet, as the sputtering apparatus 40 shown in FIG. 7. In addition, when a film forming process is conducted by such an RF sputtering method, it is also possible to adopt an apparatus in which a substrate and a cathode are both moved. Further, when adopting a configuration in which the generated plasma is provided to a substrate not in the form of a beam but rather in the form so as to encompass the substrate by arranging a cathode, which is a source of a film forming material, in the vicinity of the substrate (refer to a target plate 43 in FIG. 7), it is possible to form a film on the principal plane and the side plane of the substrate simultaneously.

(Group V Element: Gas Atmosphere Containing Nitrogen Element)

When forming the buffer layer 12 using a reactive sputtering method, important parameters in the method include a film forming temperature, a pressure, and a nitrogen ratio.

For example, when nitrogen ($N_2$) gas is used as a gas containing a nitrogen element, the ratio of nitrogen ($N_2$) with respect to argon (Ar) gas in terms of flow rate is preferably within a range of 20 to 100% nitrogen (in other words, when nitrogen is 100%, argon gas is 0%). When the flow rate of nitrogen gas is not more than 20%, the amount of available nitrogen will be low, which results in a deposition of metals on the substrate 11. Accordingly, a crystal structure required for a group III nitride compound that serves as the buffer layer 12 cannot be attained.

As a gas containing a nitrogen element which is used in the present embodiment, any generally known nitrogen compound can be used without any limitations, although ammonia and $N_2$ gas are preferred, as they are easy to handle and can be obtained comparatively cheaply.

Ammonia has a favorable level of degradation efficiency, and thus a film can be formed at a high growth rate. However, because ammonia has high reactivity and toxicity, a detoxification facility or a gas detector is required, and it is also necessary to select a chemically stable material as a member to be used in a reactor.

In addition, when nitrogen ($N_2$) is used as a source gas, high reaction rates cannot be attained, although a simple apparatus can be employed. However, if a method is used in which the nitrogen gas is broken down using an electric field or heat or the like prior to introduction into the apparatus, then a film formation rate can be achieved which, although being lower than that obtained using ammonia, is still sufficient for use in industrial production, and therefore if due consideration is also given to the cost of the apparatus, nitrogen ($N_2$) gas is the most favorable nitrogen source.

In the present embodiment, by feeding the active nitrogen reactive species onto the substrate 11 at a high concentration, the migration thereof above the substrate 11 can be suppressed, as a result of which the buffer layer 12 can be formed appropriately as a single crystal structure without forming a self assembly. In the buffer layer 12, by appropriately controlling the structure formed of a single crystal, it is possible to suitably control the level of crystallinity of a semiconductor layer that is laminated thereon and is composed of a group III nitride semiconductor.

(Substrate Temperature)

The temperature of the substrate 11 during film formation of the buffer layer 12 is preferably within a range from room temperature to 1,000° C., and more preferably within a range of 200 to 800° C. When the temperature of the substrate 11 is less than the abovementioned lower limit, the entire surface of the principal plane 11a of the substrate 11 may not be able to be covered by the buffer layer 12, and portions of the principal plane 11a may remain exposed. On the other hand, when the temperature of the substrate 11 exceeds the abovementioned upper limit, migration of the metal source material becomes very active, which results in the formation of a layer inappropriate as the buffer layer 12. Note that although the term "room temperature" described in the present invention refers to a temperature which may be affected by the process environment or the like, its specific temperature range is within 0° C. to 30° C.

(Pressure Inside Chamber)

When the buffer layer 12 is formed using a reactive sputtering method, the pressure inside the chamber 41 is preferably not less than 0.3 Pa. When the pressure inside the chamber 41 is less than 0.2 Pa, the kinetic energy of the generated reactive species will be too high, which results in the formation of a buffer layer with unsatisfactory film quality. In addition, although there are no particular limitations on the upper limit for the pressure inside the chamber 41, it is preferable that the pressure inside the chamber 41 be within a range of 0.2 to 0.8 Pa, since the dual charged particles that contribute to the film orientation interact with the charged particles in the plasma when the pressure inside the chamber 41 is not less than 0.8 Pa.

(Ultimate Vacuum Degree of Sputtering Apparatus)

In the production method of the present embodiment, it is preferable to set the condition of the ultimate vacuum degree inside the chamber 41 of the sputtering apparatus 40 used in the formation of the buffer layer 12 at a pressure of not more than $1.0 \times 10^{-3}$ Pa and to form the buffer layer 12 after achieving the degree of vacuum within this range inside the chamber 41.

As described above, when a buffer layer is formed using a reactive sputtering method, there is a possibility that the impurities adhered to the inner wall of the chamber 41 in the sputtering apparatus 40 are knocked out of the inner wall of the chamber 41 during the film formation due to the sputtering process and may contaminate the buffer layer 12 formed on the substrate 11. Such impurities inside the chamber 41 are thought to be generated mainly due to the introduction of oxygen, water, or other components contained in the air into the chamber 41 followed by the adherence thereof to the inner wall when the chamber 41 is opened to the air for its maintenance.

For this reason, in the production method of the present embodiment, it is preferable to set the condition of the ultimate vacuum degree inside the chamber 41 at a pressure of not more than $1.0 \times 10^{-3}$ Pa and to form the buffer layer 12 after achieving the degree of vacuum within this range inside the chamber 41 and reducing the amount of impurities inside the chamber 41. Due to this process, it is possible to suppress the contamination of the buffer layer 12 due to the impurities formed of, for example, oxygen, water, or the like in the air and to form the buffer layer 12 having favorable levels of orientation and crystallinity.

In addition, the buffer layer 12 is preferably formed under the condition where the ultimate vacuum degree inside the chamber 41 is set at a pressure of not more than $3.5 \times 10^{-5}$ Pa, and more preferably at a pressure of not more than $6.0 \times 10^{-6}$ Pa.

(Film Formation Rate)

The film formation rate during formation of the buffer layer 12 is preferably within a range of 0.01 to 10 nm/s. When the film formation rate is less than 0.01 nm/s, then the film grows into an island shape rather than a layer and it may become difficult to cover the surface of the substrate 11. On the other hand, when the film formation rate exceeds 10 nm/s, then the film may become amorphous rather than crystalline.

(Target)

When depositing a mixed crystal as a buffer layer by employing a reactive sputtering method in which a metallic Ga source and a gas containing a nitrogen element are activated with plasma, a method may be adopted in which a mixture of metallic materials containing Ga or the like (not necessarily a mixture forming an alloy) is used as a target, or a method may be adopted in which two targets formed of different materials are prepared followed by a simultaneous sputtering process. For example, a target formed of mixed materials may be used when depositing a film with a given composition, and a plurality of targets may be placed inside a chamber when depositing several kinds of films with different compositions.

(Heat Treatment)

In the production method of the present embodiment, prior to the lamination of a gallium nitride based compound semiconductor layer (refer to the underlying layer 14a described later) on the buffer layer that is formed by a sputtering process and is composed of GaN, it is preferable to provide a step for carrying out a heat treatment. By conducting a heat treatment, it is possible to sublime a phase having a low level of crystallinity which is contained in the buffer layer 12. Such a heat treatment can be conducted by exposing the buffer layer 12 at a temperature within a range of 500 to 1,000° C. for about 1 to 120 minutes. In addition, the temperature may be constant or may be changed gradually during the heat treatment. Moreover, it is desirable that an atmospheric gas during the heat treatment contains a reactive gas and, for example, hydrogen gas, ammonia gas, or the like can be used. Furthermore, in this process, it is not preferable to circulate an organometallic material in the atmospheric gas since crystals will be deposited.

[Formation of Semiconductor Layer]

The semiconductor layer 20 is formed by laminating the n-type semiconductor layer 14, the light emitting layer 15, and the p-type semiconductor layer 16 in this order on the buffer layer 12 formed by the abovementioned procedures. In the production method of the present embodiment, as described above, after forming the underlying layer 14a of the n-type semiconductor layer 14 through an MOCVD method, each of the n-type contact layer 14b, the n-type cladding layer 14c, the light emitting layer 15, and the p-type semiconductor layer 16 can also be formed thereon using an MOCVD method.

In the present embodiment, there are no particular limitations on the method for growing a gallium nitride based compound semiconductor (group III nitride semiconductor) when forming the semiconductor layer 20, and all the methods that are known to grow a nitride semiconductor such as a sputtering method, a hydride vapor phase epitaxy (HVPE) method, and a molecular beam epitaxy (MBE) method can be applied in addition to the abovementioned metal organic chemical vapor deposition (MOCVD) method. Among these methods, in the MOCVD method, hydrogen ($H_2$) or nitrogen ($N_2$) can be used as the carrier gas, trimethyl gallium (TMG) or triethyl gallium (TEG) can be used as the Ga source that represents the group III source material, trimethyl aluminum (TMA) or triethyl aluminum (TEA) can be used as the Al source, trimethyl indium (TMI) or triethyl indium (TEI) can be used as the In source, and ammonia ($NH_3$) or hydrazine ($N_2H_4$) can be used as the N source that represents the group V source material.

In addition, in terms of dopant element n-type impurities, monosilane ($SiH_4$) or disilane ($Si_2H_6$) can be used as the Si source material, and germane gas ($GeH_4$) or an organogermanium compound such as tetramethyl germanium (($CH_3$)$_4$Ge) or tetraethyl germanium (($C_2H_5$)$_4$Ge) can be used as the Ge source material. In the MBE method, elemental germanium can also be used as a dopant source. In terms of dopant element p-type impurities, for example, biscyclopentadienyl magnesium ($Cp_2Mg$) or bisethylcyclopentadienyl magnesium ($EtCp_2Mg$) can be used as the Mg source material.

The gallium nitride based compound semiconductor as described above can contain another group III element in addition to Al, Ga and In. Moreover, the gallium nitride based compound semiconductor can also contain dopant elements such as Ge, Si, Mg, Ca, Zn, and Be where necessary. Moreover, the elements contained are not limited to those added intentionally, and there are also cases where the semiconductor contain impurities that are inevitably contained depending on the film forming conditions and the like as well as the trace impurities contained in the source materials and the reaction tube materials.

[Formation of n-Type Semiconductor Layer]

When forming the semiconductor layer 20 according to the present embodiment, the underlying layer 14a of the n-type semiconductor layer 14 is first formed by being laminated on the buffer layer 12 through a metal organic chemical vapor deposition (MOCVD) method which has been known conventionally. Subsequently, the n-type contact layer 14b and the n-type cladding layer 14c are formed on the underlying layer 14a through the MOCVD method.

The respective layers, that is, the underlying layer 14a, the n-type contact layer 14b, and the n-type cladding layer 14c can be formed using the same MOCVD apparatus and method. Moreover, an apparatus used for forming the light emitting layer 15 described later can also be used here for the formation of the respective layers. In such a case, when forming each of the layers, various conditions of the MOCVD apparatus is changed for use where appropriate.

Note that although an example where each layer that constitutes the n-type semiconductor layer 14 is formed by the MOCVD method is described in the present embodiment, each of these layers can also be formed by a reactive sputtering method. In such a case, for example, as shown in FIG. 7, each of these layers may be formed by using the same apparatus as the sputtering apparatus 40 used for forming the buffer layer 12 while changing, where appropriate, the materials that serve as a target or the film forming conditions such as the gas atmosphere inside a chamber.

[Formation of Light Emitting Layer]

Subsequently, the light emitting layer 15 is formed on the n-type cladding layer 14c through a MOCVD method which has been known conventionally.

The light emitting layer 15 formed in the present embodiment as exemplified in FIG. 1 has a laminate structure starting with a GaN barrier layer and ending with another GaN barrier layer, and is formed by alternately laminating 7 layers of barrier layers 15a composed of GaN and 6 layers of well layers 15b composed of undoped $Ga_{0.92}In_{0.08}N$.

In addition, in the production method of the present embodiment, the light emitting layer 15 can be formed by using the same MOCVD apparatus as that used for forming the n-type semiconductor layer 14 while changing various film forming conditions.

[Formation of p-Type Semiconductor Layer]

The p-type semiconductor layer 16 composed of a p-type cladding layer 16a and a p-type contact layer 16b is formed, using the MOCVD method, on the light emitting layer 15, in other words, on the barrier layer 15a that is serving as the uppermost layer of the light emitting layer 15. The p-type semiconductor layer 16 can be formed by using the same MOCVD apparatus as that used for forming the n-type semiconductor layer 14 or the light emitting layer 15 while changing various film forming conditions.

In addition, it is also possible to form each of the layers which constitute the p-type semiconductor layer 16 by a reactive sputtering method. In such a case, for example, each of these layers may be formed by using the sputtering apparatus 40 as shown in FIG. 7 while changing, where appropriate, the materials that serve as a target or the film forming conditions such as the gas atmosphere inside a chamber.

When forming the p-type semiconductor layer 16, the p-type cladding layer 16a composed of Mg-doped $Al_{0.1}Ga_{0.9}N$ is first formed on the light emitting layer 15 (on the uppermost barrier layer 15a), and then the p-type contact layer 16b composed of Mg-doped $Al_{0.02}Ga_{0.98}N$ is formed thereon. During the formation, the lamination processes for each of the p-type cladding layer 16a and the p-type contact layer 16b can be conducted by using the same MOCVD apparatus.

Note that as described above, not only Mg but also other elements, for example, Zn or the like can be used as p-type impurities in a similar manner.

[Formation of Transparent Positive Electrode]

The transparent positive electrode 17 composed of ITO is formed on the p-type contact layer 16a of the laminated semiconductor 10 that is constituted of the respective layers formed by the abovementioned methods.

There are no particular limitations on the method for forming the transparent positive electrode 17 and the transparent positive electrode 17 can be formed through a conventional means well known in this technical field. In addition, also in terms of the structure thereof, any structure may be used without any particular limitations, including any of the conventionally known structures.

Moreover, as described above, the material used for the transparent positive electrode 17 is not limited to ITO and the transparent positive electrode 17 can be formed using other materials such as AZO, IZO, and GZO.

Additionally, after forming the transparent positive electrode 17, a thermal annealing process may be conducted for alloying or increasing transparency, or it may not be conducted.

[Formation of Positive Electrode Bonding Pad and Negative Electrode]

A positive electrode bonding pad 18 is further formed on the transparent positive electrode 17 that is formed on the laminated semiconductor 10.

This positive electrode bonding pad 18 can be formed by, for example, laminating each material, that is, Ti, Al, and Au, in this order starting from the surface side of the transparent positive electrode 17 using a conventionally known method.

In addition, when forming the negative electrode 19, a portion of the p-type semiconductor layer 16, the light emitting layer 15, and the n-type semiconductor layer 14 which are formed on the substrate 11 is first removed by a method such as a dry etching process to expose the n-type contact layer 14b and thereby forming an exposed area 14d (refer to FIGS. 2 and 3). The negative electrode 19 having a 4-layer structure, of which a detailed illustration is omitted, can be formed on this exposed area 14d by, for example, laminating each material, that is, Ni, Al, Ti, and Au, in this order starting from the surface side of the exposed area 14d using a conventionally known method.

The back plane of the substrate 11 within a wafer in which the transparent positive electrode 17, the positive electrode bonding pad 18, and the negative electrode 19 are formed on the laminated semiconductor 10 via the procedure described above is then ground and polished to form a mirror-like surface. The wafer is then cut into square chips having a side length of 350 μm so as to form a light emitting device chip (light emitting device 1).

The method according to the present embodiment for producing a group III nitride semiconductor light emitting device as described so far is a method in which a buffer layer 12 having a composition of $Al_XGa_{1-X}N$ ($0 \leq X < 1$) attained by activating, with plasma, and thereby reacting at least a metallic Ga source and a gas containing a group V element is first formed on the substrate 11, followed by the formation of the underlying layer 14a that constitutes the n-type semiconductor layer 14 on the buffer layer 12, and then each of the layers that form the semiconductor layer 20 is further laminated thereon. Accordingly, the buffer layer 12 can be formed as a layer with favorable orientation and the underlying layer 14a with a favorable level of crystallinity can be formed on the buffer layer 12. As a result, no lattice mismatch occurs between the substrate 11 and the semiconductor layer 20 composed of the group III nitride semiconductor. Due to this configuration, each of the layers which constitute the semiconductor layer 20 can be formed as a layer having an excellent level of crystallinity. In addition, since it is possible to prevent the substrate 11 from reacting with the source gas for each of the layers, which constitutes the semiconductor layer 20, by forming the buffer layer 12 so as to cover each plane of the substrate 11, the crystallinity of the semiconductor layer 20 can be improved even further. Therefore, a group III nitride semiconductor light emitting device 1 which is excellent in terms of productivity and also has excellent light emitting properties can be obtained.

[Another Example of Group III Nitride Semiconductor Light Emitting Device]

The light emitting device 1 described above has a configuration, as shown in FIGS. 2 and 3 (also refer to the laminated semiconductor 10 in FIG. 1), in which the principal plane 11a of the substrate 11 is formed solely of a (0001) c-plane. However, in the present embodiment, the form of a light emitting device is not limited to such a configuration. For example, as shown in FIGS. 4A, 4B, and 4C, it is also possible to adopt a configuration in which convex portions are formed on the upper plane of the substrate where a buffer layer will be laminated.

In the light emitting device 2 exemplified in FIG. 4A, a plurality of convex portions 63 are formed on a substrate 60 as shown in detail in a partial cross sectional diagram of FIG. 4B (also refer to FIG. 4C), whereas a portion in a principal plane 61 of the substrate 60, where no convex portions 63 are formed, serves as a plane 62 composed of a (0001) c-plane. Accordingly, as exemplified in the drawings, the principal plane 61 of the substrate 60 is constituted from the plane 62 composed of a (0001) c-plane and a plurality of convex portions 63. In addition, in the present example, a configuration is adopted in which a buffer layer 52 is formed so as to cover the principal plane 61 while burying the convex portions 63, followed by the lamination of an underlying layer 54a that constitutes a semiconductor layer 70 and is composed of a group III nitride semiconductor on this buffer layer 52; and each of the layers that constitutes the semiconductor layer 70, although its detailed illustration is omitted, is then formed on the underlying layer 54.

Note that the light emitting device 2 of the present example can be produced using the same materials and methods as those used for producing the abovementioned light emitting device 1, except that the convex portions 63 as described above are provided on the substrate 60, the buffer layer 52 is formed so as to cover the principal plane 61 composed of the plane 62 and the convex portions 63, and the underlying layer 54a is further formed thereon.

In the present example, by adopting a configuration in which the abovementioned convex portions are provided on the upper plane of a substrate and a buffer layer is formed so as to cover the upper plane, improvement effects in the internal quantum efficiency and the light emission efficiency of the light emitting device are achieved due to an action described later in detail.

The light emitting device 2 and the substrate 60 which are exemplified in FIGS. 4A, 4B, and 4C will be described below in detail.

[Substrate Configuration]

As shown in FIGS. 4B and 4C, the convex portions 63 are composed of surfaces 63c that are not in parallel with a c-plane and are portions where the c-plane does not appear in these surfaces 63c. The convex portions 63 shown in FIGS. 4B and 4C are configured so that base portions 63a thereof have a planar shape which is substantially circular with an outer shape that gradually reduces in size towards an upper section and side planes 63b thereof have a bowl-like (hemispherical) shape that is curved towards the outside. In addition, as shown in FIGS. 4B and 4C, the convex portions 63 are arranged in a grid form with regular intervals in terms of their planar arrangement.

Moreover, the convex portions 63 exemplified in FIGS. 4B and 4C are configured so as to have a base width $d_1$ within a range of 0.05 to 5 μm, a height h within a range of 0.05 to 5 μm, and at the same time, the height h is not less than ¼ of the base width $d_1$ and intervals $d_2$ between the convex portions 63 adjacent to each other are 0.5 to 5 times as large as the base width $d_1$. The base width $d_1$ of the convex portions 63 described herein refers to the maximum length in the bottom of the convex portions 63 (that is, the base portion 63a). In addition, the intervals $d_2$ between the convex portions 63 adjacent to each other refers to the distance between the base portions 63a of the convex portions 63 that are most closely arranged.

It is preferable that the intervals $d_2$ between the convex portions 63 adjacent to each other be 0.5 to 5 times as large as the base width $d_1$. If the intervals $d_2$ between the convex portions 63 are less than 0.5 times as large as the base width $d_1$, when epitaxially growing the underlying layer 54a that constitutes the semiconductor layer 70, it is difficult to promote the growth of crystals from the plane 62 composed of a c-plane and it is also difficult to completely bury the convex portions 63 with the underlying layer 54a, which may result in the formation of an unsatisfactory surface 54f of the underlying layer 54 in terms of flatness. Accordingly, when burying the convex portions 63 and growing crystals of the semiconductor layer that constitutes an LED structure on the underlying layer 54a, numerous pits are formed in this crystal which results in the impairment of the output power, electrical properties, and the like of the group III nitride semiconductor light emitting device to be formed. On the other hand, if the intervals $d_2$ between the convex portions 63 exceed 5 times as large as the base width $d_1$, when forming a group III nitride semiconductor light emitting device using the substrate 60, the frequency of diffuse reflection of light at the interface between the substrate 60 and a group III nitride semiconductor layer formed on the substrate 60 will be reduced, which may lead to insufficient improvements in terms of light emission efficiency.

It is preferable that the base width $d_1$ be within a range of 0.05 to 5 μm. If the base width $d_1$ is less than 0.05 μm, when forming a group III nitride semiconductor light emitting device using the substrate 60, the effects to reflect light diffusely may not be attained sufficiently. On the other hand, if the base width $d_1$ exceed 0.05 μm, it will be difficult to grow the underlying layer 54a epitaxially while covering the principal plane 61 so as to bury the convex portions 63.

It is preferable that the height h of the convex portions 63 be within a range of 0.05 to 5 μm. If the height h of the convex portions 63 is less than 0.05 μm, when forming a group III nitride semiconductor light emitting device using the substrate 60, the effects to reflect light diffusely may not be attained sufficiently. On the other hand, if the height h of the convex portions 63 exceed 0.05 μm, it will be difficult to grow the underlying layer 54a epitaxially so as to bury the convex portions 63, which may result in the formation of an unsatisfactory surface 54f of the underlying layer 54a in terms of flatness.

In addition, it is preferable that the height h of the convex portions 63 be not less than ¼ of the base width $d_1$. If the height h of the convex portions 63 is less than ¼ of the base width $d_1$, when forming a group III nitride semiconductor light emitting device using the substrate 60, the effects to reflect light diffusely or the effects to improve light emission efficiency may not be attained sufficiently.

Note that the configuration of the convex portions 63 is not limited to that exemplified in FIGS. 4B and 4C, and any configuration may be adopted as long as the convex portions 63 are formed of a plane that is not in parallel with a c-plane. For example, a configuration may be adopted so that base portions have a planar shape which is substantially polygonal with an outer shape that gradually reduces in size towards an upper section and side planes have a shape that is curved towards the outside. Alternatively, a configuration may be adopted so that side planes have a substantially circular cone shape or a substantially polygonal pyramid shape which is formed of a slope with an outer shape that gradually reduces in size towards an upper section. In addition, a configuration may also be adopted, in which an angle of inclination of side planes is changed in 2 stages.

Moreover, the planar arrangement of the convex portions 63 is not limited to that exemplified in FIGS. 4B and 4C either, and they may be arranged with regular intervals or may not be arranged with regular intervals. Further, in terms of the planar arrangement, the convex portions 63 may be arranged in a quadrangular arrangement, triangular arrangement, or a random arrangement.

[Method for Forming Convex Portions on Substrate]

In the present example, the convex portions 63 provided on the substrate 60 can be formed by subjecting the substrate 60 to an etching process. However, the method for forming the convex portions 63 is not limited to this process. For example, it is also possible to form convex portions by depositing, on a substrate, a material which constitutes the convex portions and is different from the substrate material. As a method for depositing a different material that constitutes convex portions on a substrate, for example, a sputtering method, a vapor deposition method, a CVD method, or the like can be used. In addition, in terms of the material that constitutes convex portions, it is preferable to use a material having a refractive index which is almost equal to that of the substrate material. For example, when a substrate is a sapphire substrate, $Al_2O_3$, SiN, $SiO_2$, or the like can be used as a material for forming convex portions.

[Formation of Buffer Layer and Underlying Layer (Semiconductor Layer)]

In the present example, the buffer layer 52 is formed on the principal plane 61 of the substrate 60, on which the above-mentioned convex portions 63 are formed, so as to cover the principal plane 60 while burying the convex portions 63 by a similar method to that used for forming the buffer layer 12 of the light emitting device 1 described above.

Subsequently, on this buffer layer 52, the underlying layer 54a composed of a group III nitride semiconductor single crystal is grown epitaxially by the MOCVD method. During this process, in the buffer layer 52, crystals oriented in the c-axis direction grow epitaxially only from the plane 62 composed of a c-plane while no crystal grows from the convex portions 63 formed of surfaces 63c that are not in parallel with the c-plane of the substrate 60. For this reason, in the present example, generation of the crystal defects such as dislocations within the crystal of the underlying layer 54a is unlikely to occur, and thus the underlying layer 54a with a favorable level of crystallinity can be formed.

Here, for example, when a c-plane is present on the surface of the convex portions, if a group III nitride semiconductor layer composed of a single crystal is grown epitaxially on a substrate where the convex portions are formed, crystals will grow from the c-plane present on the surface of the convex portions and also from the c-plane in an area where no convex portions are formed. In this case, generation of the crystal defects such as dislocations is likely to occur at parts where the crystals grown from the surface of the convex portions and the crystals grown from the area, on which no convex portions are formed, are coupled, and thus it is difficult to achieve the underlying layer 54a with a favorable level of crystallinity. Since the crystal defects generated in this process will adversely affect the crystallinity of each layers constituting the n-type semiconductor layer, the light emitting layer, and the p-type semiconductor layer which are formed on the underlying layer 54a, it is possible that these defects may cause a decline of internal quantum efficiency or an increase in the leakage current when constituting a light emitting device.

On the other hand, in the present example, since the principal plane 61 including the plane 62 composed of a c-plane and the convex portions 63 is provided on the substrate 60 by forming the convex portions 63 composed of surfaces 63c that are not in parallel with the c-plane, crystals grow only from the plane 62 when the underlying layer 54a is grown epitaxially on the principal plane 61. As a result, the underlying layer 54a formed on the principal plane 61 of the substrate 60 grows epitaxially by covering the principal plane 61 so as to bury the convex portions 63, and thus an effect is attained in which no crystal defects occur such as dislocations within the crystal.

When an LED (light emitting device) structure is constructed by forming each layers constituting the n-type semiconductor layer, the light emitting layer, and the p-type semiconductor layer on the underlying layer 54a obtained in a manner described above, the level of crystallinity of each layers will be favorable, and thus a light emitting device which is excellent in terms of internal quantum efficiency with a low level of leakage can be obtained. In addition, in the present example, as shown in FIGS. 4A, 4B, and 4C, since the convex portions 63 are formed on the substrate 60, the interface between the substrate 60 and the buffer layer 52 will become uneven, thereby making the substrate 60 and the semiconductor layer 70 (underlying layer 54a) uneven at a portion sandwiched therebetween. As a result, the diffuse reflection of light at the interface can be generated and a light emitting device with an even higher light emission efficiency can be accomplished.

[Lamp]

A lamp can be configured using techniques known to those skilled in the art by combining a group III nitride semiconductor light emitting device according to the present invention as described above, and a phosphor. Techniques for changing the light emission color by combining a light emitting device and a phosphor are conventionally well known, and these types of techniques can be adopted without any particular limitations.

For example, by appropriate selection of a phosphor, light emission having a longer wavelength than that of the light emitting device can be achieved. Moreover, by mixing the emission wavelength of the light emitting device itself and the wavelength that has been changed by the phosphor, a lamp that emits white light can also be obtained.

In addition, a lamp produced using a group III nitride semiconductor light emitting device can be used for any type of lamps such as a general-purpose cannonball shaped lamp, a side view type lamp for a backlight of a mobile phone, or a top view type lamp used for a display device.

For example, when a group III nitride semiconductor light emitting device 1 of the same electrode type is mounted in a bullet shape as exemplified in FIG. 6, the light emitting device 1 is bonded to one of the two frames (the frame 31 in FIG. 6) while the negative electrode 19 of the light emitting device 1 is connected to the other frame 32 using a wire 34 and the positive electrode bonding pad 18 of the light emitting device 1 is connected to the frame 31 using a wire 33. Further, by molding the periphery around the light emitting device 1 with a mold 35 composed of a transparent resin, a cannonball shaped lamp 3 as shown in FIG. 6 can be produced.

[Other Forms of Semiconductor Device]

The laminate structure of a group III nitride semiconductor obtained in the present embodiment and which has an excellent level of crystallinity (refer to the laminated semiconductor 10 in FIG. 1) can also be used for photoelectric conversion devices such as solar cells and light receiving elements, electronic devices such as heterojunction bipolar transistors (HBT) and high electron mobility transistors (HEMT), or the like, in addition to the semiconductor layer provided in the light emitting devices such as the light emitting diodes (LED) and laser diodes (LD) as described above. Numerous semiconductor devices of these types with various structures are already known, and any device structures including these known device structures can be adopted for a laminate structure of the group III nitride semiconductor according to the present invention without any limitations.

EXAMPLES

The group III nitride semiconductor light emitting device and the production thereof according to the present invention will be described below in more detail with reference to working Examples. However, the present invention is not limited to these working Examples.

Example 1

FIG. 1 shows a schematic cross sectional diagram of a laminated semiconductor formed of a group III nitride based compound semiconductor light emitting device produced in the present experimental example.

In the present example, a layer composed of GaN single crystal was formed as a buffer layer 12 on a c-plane of a substrate 11 composed of sapphire using an RF sputtering method, and a layer composed of GaN (group III nitride semiconductor) was then formed as an underlying layer 14a on top of the buffer layer 12 using an MOCVD method.

Formation of Buffer Layer

First, a substrate formed of a 2-inch diameter (0001) c-plane sapphire that had been polished to a mirror surface was placed inside a chamber. In this process, as a sputtering apparatus, as the sputtering apparatus 40 exemplified in FIG. 40, an apparatus having a high frequency power supply and a mechanism capable of moving the position of a magnet within a target was used. Note that a target formed of a metallic Ga material was used as the target.

The substrate 11 was heated to 750° C. inside the chamber, and following the introduction of nitrogen gas at a flow rate of 50 sccm, and with the pressure inside the chamber maintained at 0.5 Pa, a high frequency bias of 100 W was applied to the substrate 11 side, and the surface of the substrate 11 was cleaned by exposure to nitrogen plasma.

Subsequently, with the temperature of the substrate 11 held at the same level, argon gas and nitrogen gas were introduced into the sputtering apparatus. A high frequency bias of 1,000 W was then applied to the metallic Ga target side, and with the pressure inside the chamber maintained at 1.0 Pa, a single crystal buffer layer 12 composed of GaN was formed on the sapphire substrate 11 under conditions including an Ar gas flow rate of 10 sccm and a nitrogen gas flow rate of 30 sccm (proportion of nitrogen gas was 75% of the total gas). The magnet within the target was set to swing during both the cleaning operation of the substrate 11 and the film formation.

Using a premeasured film formation rate (that is, 2.0 nm/s), treatment was conducted for a specific period of time to form a GaN layer (buffer layer 12) having a thickness of 20 nm, and the plasma operation was then halted and the temperature of the substrate 11 was lowered.

The X-ray rocking curve (XRC) for the buffer layer 12 formed on the substrate 11 was then measured using an X-ray measurement apparatus (model: X 'part Pro MRD, manufactured by Spectris Co., Ltd.). The measurement was conducted using a CuKα X-ray beam generation source as the X-ray source. The measurement result revealed that the XRC full width at half maximum for the buffer layer 12 was 0.12 degree in the (0002) plane and was 1.4 to 1.5 degree in the (10-10) plane, which represents an excellent result, and confirmed that the buffer layer 12 was favorably oriented.

[Formation of n-Type Semiconductor Layer]

The substrate 11 having the GaN layer (that is, the buffer layer 12) formed thereon was removed from the sputtering apparatus and transported into an MOCVD apparatus, and the n-type semiconductor layer 14 was then formed on the buffer layer 12 using the procedure described below.

[Formation of Underlying Layer]

The underlying layer 14a composed of GaN was formed on the buffer layer 12 using the procedure described below. Here, a conventionally known MOCVD apparatus was used for forming the underlying layer 14a.

First, the substrate 11 was introduced to the inside of the MOCVD apparatus and was placed on a carbon susceptor used for heating within a glove box, the inside of which was substituted with nitrogen. Subsequently, following the circulation of nitrogen gas inside the MOCVD furnace, the heater was activated and the substrate temperature was raised to 1,150° C. Then, once it had been confirmed that the temperature had stabilized, introduction of ammonia gas into the MOCVD furnace was commenced by opening a valve of the ammonia gas piping.

Hydrogen gas containing trimethyl gallium (TMG) vapor was then supplied to the MOCVD apparatus, thereby starting the formation of a group III nitride semiconductor (GaN) that constitutes the underlying layer 14a on the buffer layer 12. At this point, the amount of ammonia was adjusted so as to achieve the (group V element)/(group III element) ratio of 6,000. After growing a GaN layer as described above over a period of approximately one hour, by switching a valve of the TMG piping, supply of the source materials to the MOCVD furnace was then stopped, thereby halting growth of the GaN layer. Subsequently, power supply to the heater was halted, and the temperature of the substrate was lowered to room temperature.

Using the types of procedures described above, the underlying layer 14a composed of an undoped GaN layer having a film thickness of 2 μm was formed on the buffer layer 12, which was formed on the substrate 11 and was composed of a GaN single crystal structure. The sample removed from the MOCVD furnace after the film formation was colorless and transparent, and the surface of a GaN layer (underlying layer 14a) had a mirror-like appearance.

The X-ray rocking curve (XRC) for the underlying layer 14a composed of an undoped GaN layer formed as described above was then measured using an X-ray measurement apparatus (model: X 'part Pro MRD, manufactured by Spectris Co., Ltd.). The measurements were conducted using a Cuβ X-ray beam generation source as the X-ray source, and were conducted for the symmetrical (0002) plane and the asymmetrical (10-10) plane. Generally, in the case of a group III nitride semiconductor, the spectral full width at half maximum in the XRC of the (0002) plane acts as an indicator of the crystal flatness (mosaicity), whereas the spectral full width at half maximum in the XRC of the (10-10) plane acts as an indicator of the dislocation density (twist). The measurement results revealed that for the undoped GaN layer produced using the production method of the present invention, the full width at half maximum value was 164 arcsec in the measurement of the (0002) plane and 247 arcsec in the measurement of the (10-10) plane.

[Formation of n-Type Contact Layer]

Following the formation of the underlying layer 14a, the same MOCVD apparatus was used to form an n-type contact layer composed of GaN. During this formation, the n-type contact layer was doped with Si. With the exception of supplying $SiH_4$ as the Si dopant source material, crystal growth was conducted under the same conditions as those used for the underlying layer 14a. In addition, a conventionally known MOCVD apparatus was used for forming the n-type contact layer 14b.

Using the types of procedures described above, the surface of the substrate 11 composed of sapphire was subjected to reverse sputtering, the buffer layer 12 formed of GaN having a single crystal structure was formed on the substrate 11, and an undoped GaN layer (the n-type underlying layer 14a) with a film thickness of 2 μm and an Si-doped GaN layer (the n-type contact layer 14b) with a film thickness of 2 μm and having a carrier concentration of $5 \times 10^{18}$ cm$^{-3}$ were then formed on the buffer layer 12.

[Formation of n-Type Cladding Layer]

Using the procedure described below and an MOCVD method, an n-type cladding layer 14c was laminated on top of the n-type contact layer of the sample produced using the procedure described above.

First, by circulating ammonia gas through inside the chamber of an MOCVD apparatus and using nitrogen as a carrier gas, the temperature of the substrate bearing the n-type contact layer composed of an Si-doped GaN layer was lowered to 760° C.

In addition, while waiting for the temperature inside the furnace to adjust, the $SiH_4$ supply rate was set. The amount of $SiH_4$ circulated was calculated in advance, and was adjusted so as to yield an electron concentration within the Si-doped layer of $4 \times 10^{18}$ cm$^{-3}$. The supply of ammonia to the furnace was continued at the same flow rate.

Subsequently, with ammonia gas flowing through the chamber, $SiH_4$ gas and vapors of TMI and TEG generated by bubbling were supplied to the furnace, thereby forming a layer composed of $Ga_{0.99}In_{0.01}N$ with a thickness of 1.7 nm, and a layer composed of GaN with a thickness of 1.7 nm. After repeating 19 cycles of this type of film formation treatment, a layer composed of $Ga_{0.99}In_{0.01}N$ with a thickness of 1.7 nm was finally grown. Further, while this treatment was being conducted, the flow of $SiH_4$ was continued. This enabled the formation of an n-type cladding layer 14c composed of a superlattice structure of Si-doped $Ga_{0.99}In_{0.01}N$ and GaN with a thickness of 60 nm.

[Formation of Light Emitting Layer]

Subsequently, the light emitting layer 15 was formed which was constituted of a barrier layer 15a composed of GaN and a well layer 15b composed of $Ga_{0.92}In_{0.08}N$ and had a multiple quantum well structure. In order to form this light emitting layer 15, the barrier layer 15a was first formed on the n-type cladding layer 14c composed of Si-doped $Ga_{0.99}In_{0.01}N$, and the well layer 15b composed of $Ga_{0.92}In_{0.08}N$ was then formed on top of this barrier layer 15a. This type of lamination procedure was repeated six times, and a seventh barrier layer 15a was then formed on top of the sixth laminated well layer 15b, thereby forming a structure in which a barrier layer 15a was positioned at both sides of the light emitting layer 15 having a multiple quantum well structure.

First, with the substrate temperature held at 760° C., supply of TEG and $SiH_4$ to the furnace was commenced, an initial barrier layer composed of Si-doped GaN with a thickness of 0.8 nm was formed over a predetermined time period, and the supply of TEG and $SiH_4$ was then halted. Thereafter, the temperature of the susceptor was raised to 920° C. Supply of TEG and $SiH_4$ to the furnace was then restarted, and with the substrate temperature held at 920° C., an intermediate barrier layer with a thickness of 1.7 nm was grown, and the supply of TEG and $SiH_4$ to the furnace was once again halted. Subsequently, the susceptor temperature was lowered to 760° C., supply of TEG and $SiH_4$ was again restarted, and following formation of a final barrier layer with a thickness of 3.5 nm, the supply of TEG and $SiH_4$ was once again halted, completing formation of the GaN barrier layer. By using this type of 3-stage film formation process, a Si-doped GaN barrier layer (the barrier layer 15a) composed of three layers, that is, an initial barrier layer, an intermediate barrier layer, and a final barrier layer was formed with a total film thickness of 5 nm. The amount of $SiH_4$ was adjusted so as to yield a Si concentration of $1 \times 10^{17}$ cm$^{-3}$.

Following formation of the barrier layer 15a, with the temperature of the substrate 11, pressure inside the furnace, and the flow rate and the types of carrier gas being unchanged, TEG and TMI were supplied to the furnace by switching the valves of TEG and TMI, thereby forming a well layer 15b composed of $Ga_{0.92}In_{0.08}N$. As a result, the well layer 15b with a film thickness of 2 nm was formed.

Then, following completion of the formation of the well layer 15b composed of $Ga_{0.92}In_{0.08}N$, the setting for the TEG supply rate was altered. Subsequently, supply of TEG and $SiH_4$ was restarted, and a second barrier layer 15a was formed.

By repeating the above procedure six times, six barrier layers 15a composed of Si-doped GaN and six well layers 15b composed of $Ga_{0.92}In_{0.08}N$ with a nonuniform in-plane thickness were formed.

Following formation of the sixth well layer 15b composed of $Ga_{0.92}In_{0.08}N$, a seventh barrier layer 15a was formed. In the formation process for this seventh barrier layer, the supply of $SiH_4$ was first halted, an initial barrier layer composed of undoped GaN was formed, the substrate temperature was then raised to 920° C. while the supply of TEG to the furnace was continued, an intermediate barrier layer was grown over a prescribed time period at a substrate temperature of 920° C., and the supply of TEG to the furnace was then halted. Subsequently, the substrate temperature was cooled to 760° C., the supply of TEG was restarted, and following formation of a final barrier layer, the supply of TEG was once again halted, completing formation of the GaN barrier layer. By using this formation process, an undoped GaN barrier layer composed of three layers, namely, the initial barrier layer, the intermediate barrier layer and the final barrier layer, was formed with a total film thickness of 4 nm (refer to the uppermost barrier layer 15a of the light emitting layer 15 shown in FIGS. 1 and 3).

By using the procedure outlined above, a light emitting layer 15 was formed with a multiple quantum well structure containing well layers of nonuniform thickness (equivalent to the first to fifth well layers 15b from the n-type semiconductor layer 14 side in FIG. 3) and a well layer having a uniform thickness (equivalent to the sixth well layer 15b from the n-type semiconductor layer 14 side in FIGS. 1 and 3).

[Formation of p-Type Semiconductor Layer]

Following each of the processes described above, the same MOCVD apparatus was used to form a p-type cladding layer 16a having a superlattice structure formed of four layers of undoped $Al_{0.06}Ga_{0.94}N$ and three layers of Mg-doped $Al_{0.01}Ga_{0.99}N$, and then a p-type contact layer 16b composed of a Mg-doped GaN with a film thickness of 200 nm, thereby completing the p-type semiconductor layer 16.

First, the substrate temperature was raised to 975° C. while $NH_3$ gas was supplied, and the carrier gas was then switched from nitrogen to hydrogen at this temperature. Subsequently, the substrate temperature was increased to 1,050° C. TMG and TMA were then supplied to the furnace, thereby forming a 2.5 nm layer of undoped $Al_{0.06}Ga_{0.94}N$. Subsequently, with no time interval allowed, the TMA valve was closed and a $Cp_2Mg$ valve was opened, thereby forming a Mg-doped GaN layer with a thickness of 2.5 nm.

By repeating the above type of operation three times, and then forming an undoped $Al_{0.06}Ga_{0.94}N$ layer finally, a p-type cladding layer 16a having a superlattice structure was formed.

Thereafter, only $Cp_2Mg$ and TMG were supplied to the furnace, and a p-type contact layer 16b composed of p-type GaN with a thickness of 200 nm was formed.

As a result, the p-type semiconductor layer 16 was finally formed which was constituted of the p-type cladding layer 16a with a film thickness of 15 nm and the p-type contact layer 16b composed of Mg-doped $Al_{0.02}Ga_{0.98}N$ with a film thickness of 20 nm.

The epitaxial wafer for an LED prepared in the manner described above has a laminated structure in which an GaN layer (the buffer layer 12) having a single crystal structure is first formed on a substrate 11 composed of sapphire having a c-plane, and sequentially thereafter are formed, from the substrate 11 side, a 6 μm undoped GaN layer (the underlying layer 14a), an n-type contact layer 14b composed of a Si-doped GaN with a film thickness of 2 μm and having an electron concentration of $5 \times 10^{18}$ $cm^{-3}$, the n-type cladding layer 14c having a Si concentration of $4 \times 10^{18}$ $cm^{-3}$ and having a superlattice structure composed of 20 layers of 1.7 nm $Ga_{0.99}In_{0.01}N$ and 19 layers of 1.7 nm GaN, a multiple quantum well structure (the light emitting layer 15) that begins with a GaN barrier layer and ends with a GaN barrier layer, and is composed of six Si-doped GaN barrier layers (the barrier layers 15a) each having a layer thickness of 5 nm, six layers of undoped $Ga_{0.92}In_{0.08}N$ well layers (the well layers 15b) each having a layer thickness of 2 nm, and an uppermost barrier layer containing a final barrier layer composed of undoped GaN (equivalent to the uppermost barrier layer 15a within the light emitting layer 15 shown in FIGS. 1 and 3), and a p-type semiconductor layer 16 composed of a p-type cladding layer 16a formed of four layers of undoped $Al_{0.06}Ga_{0.94}N$ of thickness 2.5 nm and three layers of Mg-doped $Al_{0.01}Ga_{0.99}N$ of thickness 2.5 nm and having a superlattice structure, and a p-type contact layer 16b composed of Mg-doped GaN with a film thickness of 200 nm.

[Preparation of LED]

The epitaxial wafer (laminated semiconductor 10) obtained as described above was then used to prepare an LED.

In other words, a conventional photolithography technique was used to form a transparent positive electrode 17 composed of ITO on the surface of the Mg-doped AlGaN layer (the p-type contact layer 16b) of the abovementioned epitaxial wafer, and a positive electrode bonding pad 18 (a p-electrode bonding pad) was formed by sequentially laminating titanium, aluminum and gold onto the transparent positive electrode 17, thus completing the p-side electrode. The wafer was then subjected to dry etching to expose a region of the n-type contact layer 14b (that is, an exposed area 14d) for forming the n-side electrode (the negative electrode), and the negative electrode 19 (the n-side electrode) was then formed by sequentially laminating four layers, namely Ni, Al, Ti and Au, onto this exposed area 14d. Using such a procedure, electrodes having the shapes as shown in FIG. 2 were formed on the wafer (refer to the laminated semiconductor 10 in FIG. 1).

The back plane of the substrate 11 composed of sapphire within the wafer where the p-side and n-side electrodes were formed via the procedure outlined above was then ground and polished to form a mirror-like surface. The wafer was then cut into square chips having a side length of 350 μm, the chip was then positioned on a lead frame so that each electrode was facing upwards, and gold wiring was used to connect the electrodes to the lead frame, thus forming a light emitting device (refer to the lamp 3 in FIG. 6).

When a forward current was caused to flow between the p-side and n-side electrodes of the light emitting diode prepared as described above, the forward voltage at a current of 20 mA was 3.0 V. In addition, when the state of light emission was observed through the p-side transparent positive electrode 17, the emission wavelength was 450 nm and the light emission output was 20 mW. In the produced light emitting diodes, these types of light emission properties were obtained with minimal variation across almost the entire surface of the wafer.

[Experimental Example]

Figure 8A:
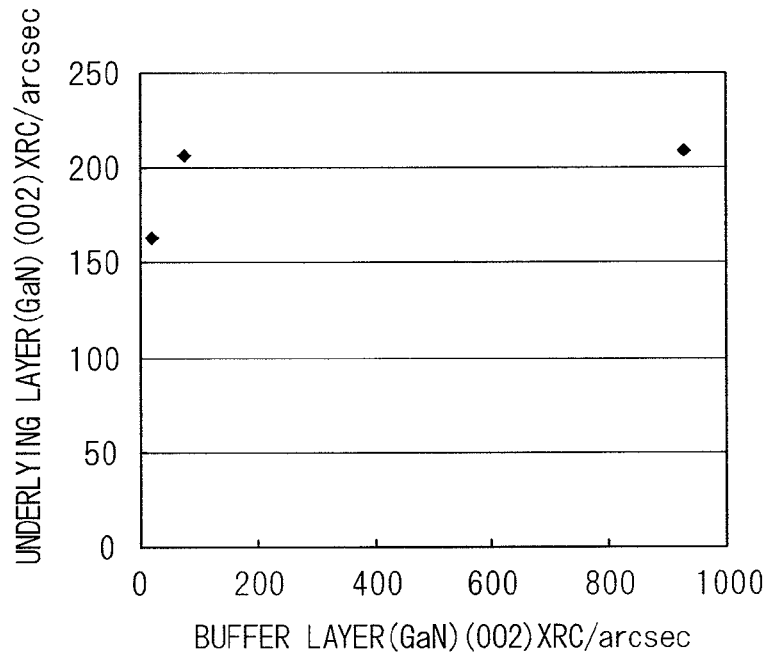
FIGS. 8A and 8B are diagrams describing a working Example concerning the method according to the present invention for producing a group III nitride semiconductor light emitting device.
Figure 8B:
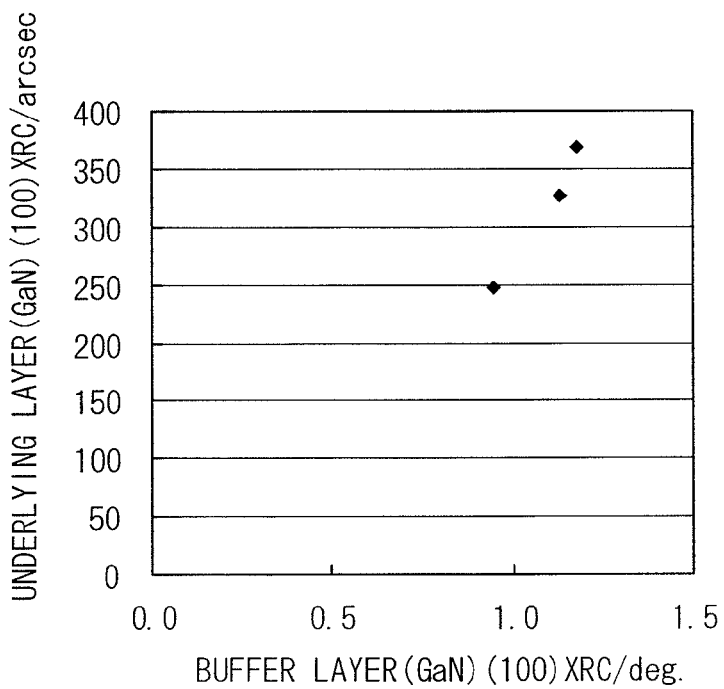

An experimental example for demonstrating the present invention will be described below using the respective graphs in FIGS. 8A and 8B. FIG. 8A is a graph showing the relationship between the XRC full width at half maximum of a (0002) plane of the GaN buffer layer and that of the GaN underlying layer, and FIG. 8B is a graph showing a similar relationship, in terms of the XRC full width at half maximum, for (10-10) planes.

In the present experimental example, the respective test samples No. 1 to 3 were prepared having a GaN buffer layer formed on a sapphire substrate and a GaN underlying layer formed on the buffer layer by a similar method to that used in the above working Example except that the film formation time and the substrate temperature during film formation was changed where appropriate.

Note that in the production process of the above respective samples No. 1 to 3, following formation of the buffer layer on the substrate, the full width at half maximum in X-ray rocking curve for the buffer layer in the (0002) and (10-10) planes was measured for each test sample layer by a similar method to that used in Example 1. In addition, following formation of the underlying layer on the buffer layer, measurement of the full width at half maximum in X-ray rocking curve was performed for the underlying layer in the (0002) plane and the (10-10) plane by the same method.

As shown in the graph of FIG. 8A, the XRC full width at half maximum for the underlying layer in the (0002) plane was approximately 210 arcsec and was stable when the XRC full width at half maximum for the buffer layer in the (0002) plane was within a range of 80 to 900 arcsec. In addition, the XRC full width at half maximum for the underlying layer in the (0002) plane was approximately 160 arcsec when the XRC full width at half maximum for the buffer layer in the (0002) plane was approximately 20 arcsec. Accordingly, the layers were confirmed to exhibit a favorable level of flatness.

Moreover, as shown in the graph of FIG. 8B, the XRC full width at half maximum for the buffer layer in the (10-10) plane and the XRC full width at half maximum for the underlying layer in the (10-10) plane were almost correlated, and the layers were confirmed to exhibit a favorable level of crystallinity by referring to these data; for example, when the XRC full width at half maximum for the buffer layer in the (10-10) plane was approximately 0.95°, the XRC full width at half maximum for the underlying layer in the (10-10) plane was approximately 248 arcsec.

As shown in the above results, the buffer layer composed of GaN which was formed on a substrate under the conditions specified by the production method of the present invention has excellent levels of flatness and crystallinity, and the improvement of crystallinity of the underlying layer which was formed on the buffer layer was also confirmed. Accordingly, it is apparent that the crystallinity of each layers which is formed on the underlying layer and is composed of a group III nitride semiconductor will also improve, and a light emitting device having excellent light emitting properties can be produced.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for producing a group III nitride semiconductor light emitting device which is a method for producing a group III nitride semiconductor light emitting device, in which a buffer layer composed of a group III nitride compound is laminated on a substrate and then an n-type semiconductor layer provided with an underlying layer, a light emitting layer, and a p-type semiconductor layer are sequentially laminated on the buffer layer, the method comprising:
    forming the buffer layer having a composition of $Al_xGa_{1-x}N$ ($0 \leqq X < 1$) by activating, with plasma, and thereby reacting at least a metallic Ga source and a gas containing a group V element; and
    forming the underlying layer on the buffer layer,
    wherein the buffer layer is formed by a reactive sputtering method in which a gas containing a group V element is made to circulate inside a reactor.

2. The method for producing a group III nitride semiconductor light emitting device according to claim 1,
    wherein the underlying layer is formed by a metal organic chemical vapor deposition (MOCVD) method.

3. The method for producing a group III nitride semiconductor light emitting device according to claim 1,
    wherein the buffer layer is formed by a radio frequency (RF) sputtering method.

4. The method for producing a group III nitride semiconductor light emitting device according to claim 3,
    wherein the buffer layer is formed by an RF sputtering method while moving a magnet of a cathode.

5. The method for producing a group III nitride semiconductor light emitting device according to claim 1,
    wherein the buffer layer is formed by a direct current (DC) sputtering method.

6. The method for producing a group III nitride semiconductor light emitting device according to claim 5,
    wherein the buffer layer is formed by a pulsed DC sputtering method.

7. The method for producing a group III nitride semiconductor light emitting device according to claim 1,
    wherein the buffer layer is formed so as to cover at least 90% of a surface of the substrate.

8. The method for producing a group III nitride semiconductor light emitting device according to claim 1,
    wherein the buffer layer is formed by making a temperature of the substrate within a range of room temperature to 1,000° C.

9. The method for producing a group III nitride semiconductor light emitting device according to claim 8,
    wherein the buffer layer is formed by making a temperature of the substrate within a range of 200 to 800° C.

10. The method for producing a group III nitride semiconductor light emitting device according to claim 1,
    wherein the group V element is nitrogen and a nitrogen gas fraction in the gas when forming the buffer layer is within a range of 20 to 100%.

11. The method for producing a group III nitride semiconductor light emitting device according to claim 1,
    wherein the buffer layer is produced inside a chamber of a film forming apparatus under a condition of an ultimate vacuum degree of $1.0 \times 10^{-3}$ Pa or less.

12. The method for producing a group III nitride semiconductor light emitting device according to claim 11,
    wherein the buffer layer is produced inside a chamber of a film forming apparatus under a condition of an ultimate vacuum degree of $3.5 \times 10^{-5}$ Pa or less.

13. The method for producing a group III nitride semiconductor light emitting device according to claim 11,
    wherein the buffer layer is produced inside a chamber of a film forming apparatus under a condition of an ultimate vacuum degree of $6.0 \times 10^{-6}$ Pa or less.

14. The method for producing a group III nitride semiconductor light emitting device according to claim 1,
    wherein a pressure inside a chamber of a film forming apparatus is not less than 0.3 Pa when forming the buffer layer.

15. The method for producing a group III nitride semiconductor light emitting device according to claim 1,
    wherein a film formation rate is within a range of 0.01 nm/s to 10 nm/s when forming the buffer layer.

16. A group III nitride semiconductor light emitting device obtained by the method of claim 1.

* * * * *